(12) United States Patent
Kim et al.

(10) Patent No.: US 11,094,741 B2
(45) Date of Patent: Aug. 17, 2021

(54) DISPLAY DEVICE

(71) Applicant: SAMSUNG DISPLAY CO., LTD., Yongin-si (KR)

(72) Inventors: Dong Gyun Kim, Yongin-si (KR); Moon Jung An, Yongin-si (KR); Dong Eon Lee, Yongin-si (KR); Hye Lim Kang, Yongin-si (KR); Hoo Keun Park, Yongin-si (KR); Byung Ju Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/738,490

(22) Filed: Jan. 9, 2020

(65) Prior Publication Data
US 2020/0403029 A1 Dec. 24, 2020

(30) Foreign Application Priority Data
Jun. 19, 2019 (KR) .................. 10-2019-0073076

(51) Int. Cl.
*H01L 27/15* (2006.01)
*H01L 33/50* (2010.01)
*H01L 33/58* (2010.01)

(52) U.S. Cl.
CPC .......... *H01L 27/156* (2013.01); *H01L 33/505* (2013.01); *H01L 33/58* (2013.01)

(58) Field of Classification Search
CPC ............... H01L 27/156; H01L 27/1222; H01L 27/1218; H01L 27/322; H01L 27/3258
See application file for complete search history.

(56) References Cited

U.S. PATENT DOCUMENTS

| 9,978,472 | B2 | 5/2018 | Kim et al. | |
|---|---|---|---|---|
| 10,373,985 | B2 | 8/2019 | Kim et al. | |
| 2016/0011351 | A1 | 1/2016 | Tomohisa et al. | |
| 2017/0294451 | A1* | 10/2017 | Kim | H01L 27/124 |
| 2020/0343315 | A1* | 10/2020 | Lin | H01L 51/5228 |

FOREIGN PATENT DOCUMENTS

| JP | 2012-174941 A | 9/2012 |
|---|---|---|
| KR | 10-1665173 B1 | 10/2016 |
| KR | 10-1791839 B1 | 10/2017 |

* cited by examiner

*Primary Examiner* — Changhyun Yi
(74) *Attorney, Agent, or Firm* — Lewis Roca Rothgerber Christie LLP

(57) ABSTRACT

A display device includes a substrate; a first electrode and a second electrode arranged to be spaced apart from each other on the substrate; a first insulating layer on the substrate; a light emitting element on the first insulating layer, located between the first electrode and the second electrode, and including a first end portion and a second end portion; a third electrode on the substrate and electrically connected to the first electrode and the first end portion; a fourth electrode on the substrate and electrically connected to the second electrode and the second end portion; a second insulating layer on the substrate and covering the light emitting element, the third electrode, and the fourth electrode; and a light diffusion layer on the second insulating layer and including a light diffusion particle.

19 Claims, 13 Drawing Sheets

DISPLAY DEVICE

CROSS-REFERENCE TO RELATED APPLICATION

This application claims priority to and the benefit of Korean Patent Application No. 10-2019-0073076, filed on Jun. 19, 2019 in the Korean Intellectual Property Office, the entire content of which is incorporated herein by reference.

BACKGROUND

1. Field

Aspects of embodiments of the present invention relate to a display device.

2. Description of the Related Art

A display device may display an image by using a light emitting element, such as a light emitting diode, as a light source of a pixel. The light emitting diode exhibits relatively good durability under harsh environmental conditions and exhibits excellent performance in terms of lifetime and luminance.

Recently, a research is underway to manufacture a light emitting diode by using materials of highly reliable inorganic crystal structure and to use it as a light source of a pixel of a next generation by disposing it on a panel of a display device. As a part of this research, development of a display device for manufacturing a light emitting diode with a small scale, such as a microscale or nanoscale, and for using it as a light source of each pixel is underway.

SUMMARY

According to an aspect of embodiments of the present invention, a display device includes a light emitting element. According to another aspect of embodiments of the present invention, light emitting elements may be arranged in a display device with a certain (e.g., predetermined) position and distance.

At this time, light emitted from the light emitting element, which is a point light source, may be visually recognized in a certain (e.g., predetermined) pattern to a user. When adding a separate light diffusion member on a display device, optical characteristics of a display device such as luminance may be deteriorated.

According to an aspect of embodiments of the present invention, a display device with improved uniformity of light emitted without deteriorated optical characteristics is provided.

However, aspects of embodiments of the present invention are not limited to the aspect mentioned above, and other aspects and technical objects that are not mentioned may be clearly understood by a person of an ordinary skill in the art using the following description.

A display device according to one or more embodiments of the present invention includes: a substrate; a first electrode and a second electrode arranged to be spaced apart from each other on the substrate; a first insulating layer on the substrate; a light emitting element on the first insulating layer, located between the first electrode and the second electrode, and including a first end portion and a second end portion; a third electrode on the substrate and electrically connected to the first electrode and the first end portion; a fourth electrode on the substrate and electrically connected to the second electrode and the second end portion; a second insulating layer on the substrate and covering the light emitting element, the third electrode, and the fourth electrode; and a light diffusion layer on the second insulating layer and including a light diffusion particle.

The light diffusion particle may include at least one of a silver nanowire, a gold nanowire, a carbon nanowire, and a nickel nanowire.

The light diffusion layer may further include a light scattering particle, and the light scattering particle may include at least one of titanium oxide ($TiO_2$), aluminum oxide ($Al_2O_3$), indium oxide ($In_2O_3$), zinc oxide (ZnO), tin oxide ($SnO_2$), and silica.

The display device may further include a first bank and a second bank on the substrate and arranged to be spaced apart from each other, wherein the first bank may overlap with the first electrode, and the second bank may overlap with the second electrode.

The first insulating layer may include a first opening exposing at least a portion of the first electrode, and a second opening exposing at least a portion of the second electrode, and the first opening may overlap with the first bank, and the second opening may overlap with the second bank.

A space may be defined between the light emitting element and the first insulating layer.

The display device may further include a first insulating pattern on the light emitting element, wherein the first insulating pattern may expose the first end portion and the second end portion of the light emitting element.

The display device may further include a second insulating pattern on the third electrode, wherein the second insulating pattern may be arranged both on a region including the first end portion of the light emitting element and on the third electrode, and may cover an end of the third electrode on the light emitting element.

The display device may further include a bank pattern on the substrate and surrounding the light emitting element in a plane view.

The light diffusion layer may overlap with the light emitting element and may not overlap with the bank pattern.

The display device may further include a wavelength conversion layer on the light emitting element and including a wavelength conversion particle, wherein the wavelength conversion particle may include a quantum dot.

A display device according to one or more embodiments of the present invention includes: a first pixel in a display area, wherein the first pixel includes a substrate; a first electrode and a second electrode arranged to be spaced apart from each other on the substrate; a first insulating layer on the substrate and exposing a portion of the first electrode and a portion of the second electrode; a light emitting element on the first insulating layer, located between the first electrode and the second electrode, and including a first end portion and a second end portion; a third electrode on the substrate and electrically connected to the first electrode and the first end portion; a fourth electrode on the substrate and electrically connected to the second electrode and the second end portion; a second insulating layer on the substrate and covering the light emitting element, the third electrode, and the fourth electrode; a light diffusion layer on the second insulating layer and including a light diffusion particle; and a first wavelength conversion layer on the substrate and including a first wavelength conversion particle, wherein the light emitting element emits light of a first color, and the first wavelength conversion particle converts the light of the first color into light of a second color.

The display device may further include a second pixel in the display area and arranged adjacent to the first pixel, wherein the second pixel may include a second wavelength conversion layer including a second wavelength conversion particle, and the second wavelength conversion particle may convert the light of the first color into light of a third color.

The display device may further include a third pixel in the display area and arranged adjacent to the first pixel and the second pixel, wherein the third pixel may include a light scattering particle, and the light scattering particle may include at least one of titanium oxide ($TiO_2$), aluminum oxide ($Al_2O_3$), indium oxide ($In_2O_3$), zinc oxide (ZnO), tin oxide ($SnO_2$), and silica.

The display device may further include a bank pattern between the first pixel and the second pixel, wherein the light diffusion layer may not overlap with the bank pattern.

The light diffusion layer may be between the light emitting element and the first wavelength conversion layer.

The display device may further include a passivation layer covering the first wavelength conversion layer, wherein the light diffusion layer may be on the passivation layer.

A display device according to one or more embodiments of the present invention includes: a substrate; a first electrode and a second electrode arranged to be spaced apart from each other on the substrate; a first insulating layer on the substrate; a light emitting element on the first insulating layer, located between the first electrode and the second electrode, and including a first end portion and a second end portion; a third electrode on the substrate and electrically connected to the first electrode and the first end portion; a fourth electrode on the substrate and electrically connected to the second electrode and the second end portion; a second insulating layer on the substrate and covering the light emitting element, the third electrode, and the fourth electrode; and a wavelength conversion layer on the second insulating layer and including a wavelength conversion particle and a light diffusion particle, wherein the light diffusion particle includes at least one of a silver nanowire, a gold nanowire, a carbon nanowire, and a nickel nanowire.

Aspects of other embodiments are included in the detailed description and drawings.

According to an aspect of embodiments of the present invention, a light diffusion layer is disposed on a light emitting element to provide a display device with improved uniformity of light emitted without deteriorated optical characteristics.

However aspects and effects of embodiments of the present invention are not limited by those discussed above, and further various effects are included in the present specification.

DETAILED DESCRIPTION

Figure 1A:
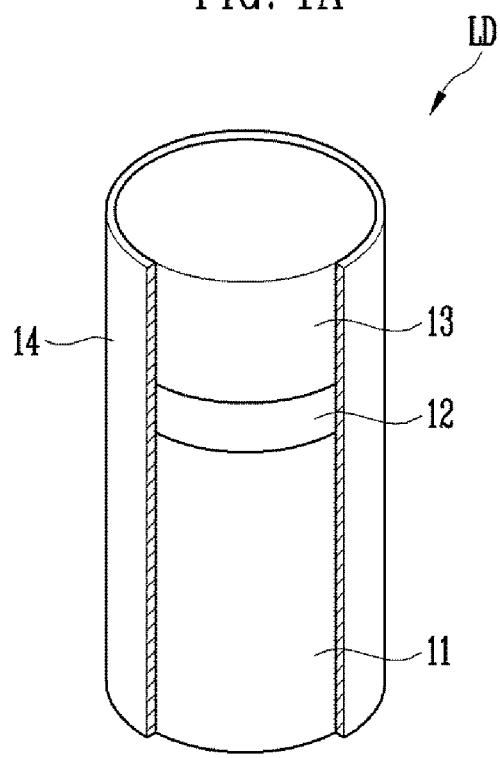
FIGS. 1A and 1B are perspective views of a light emitting element according to embodiments.

Aspects and features of the present invention, and implementation methods thereof will be clarified through the following example embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is defined by the scope of the claims.

It is to be understood that when an element or a layer is referred to as being "on" another element or layer, it may be directly on another element or layer, or one or more intervening elements or layers may also be present.

Although the terms "first," "second," and the like are used to describe various constituent elements, these constituent elements are not limited by these terms. These terms are used to distinguish one constituent element from another constituent element. Therefore, "first" constituent elements described below may be second constituent elements within the technical spirit of the present invention. When explaining the singular, unless explicitly described to the contrary, it may be interpreted as the plural meaning.

Meanwhile, some of the elements not directly related to the features of the present invention in the drawing may be omitted in order to clearly illustrate the present invention. In addition, some of the elements in the drawings may be shown in somewhat exaggerated sizes, ratios, and the like. For the same or similar constituent elements throughout the drawings, the same reference numerals and symbols may be provided even if they are displayed on different drawings, and duplicate descriptions may be omitted.

It is to be further understood that the terms "comprises" and/or "comprising" used herein specify the presence of stated features or components, but do not preclude the presence or addition of one or more other features or components.

In embodiments set forth herein, when a layer, area, or component is connected to another layer, area, or component, the layers, areas, or components may be directly connected to each other, and the layers, areas, or components may also be indirectly connected to each other with another layer, area, or component therebetween.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Herein, referring to the drawings, some example embodiments of the present invention will be described in further detail.

Figure 1B:
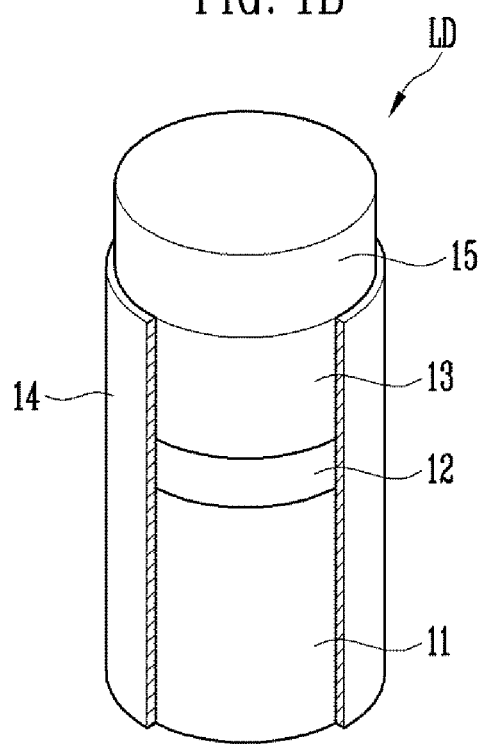

FIGS. 1A and 1B are perspective views of a light emitting element according to embodiments.

Referring to FIGS. 1A and 1B, a light emitting element LD according to an embodiment of the present invention may include a first semiconductor layer 11, a second semiconductor layer 13, and an active layer 12 interposed between the first and second semiconductor layers 11 and 13. For example, the light emitting element LD may be implemented as a laminate in which the first semiconductor layer 11, the active layer 12, and the second semiconductor layer 13 are sequentially stacked.

According to an example embodiment of the present invention, the light emitting element LD may be provided in a rod shape extending in a direction. When an extending direction of the light emitting element LD is referred to as a length direction, the light emitting element LD may have a first end portion EP1 and a second end portion EP2 in the length direction.

In an embodiment of the present invention, one of the first and second semiconductor layers 11 and 13 may be disposed in the first end portion EP1, and the other of the first and second semiconductor layers 11 and 13 may be disposed in the second end portion EP2. For example, the first semiconductor layer 11 may be disposed in the first end portion EP1, and the second semiconductor layer 13 may be disposed in the second end portion EP2.

In an example embodiment of the present invention, the light emitting element LD may be provided in a rod shape. Here, "rod-shaped" refers to rod-like shapes or bar-like shapes that are long in the length direction (i.e., having an aspect ratio greater than 1), such as a circular column or a polygonal column. For example, a length of the light emitting element LD may be greater than a diameter thereof. However, the present invention is not limited thereto. For example, a light emitting element may have a core-shell structure.

In an embodiment, the light emitting element LD may be small enough to have a diameter and/or a length such as microscale or nanoscale. For example, the diameter of the light emitting element LD may be 600 nm or less, and the length of the light emitting element LD may be 4 μm or less. However, a size of the light emitting element LD is not limited thereto. For example, the size of the light emitting element LD may be changed to meet a requirement condition.

In an embodiment, the first semiconductor layer 11 may include at least one n-type semiconductor layer. For example, the first semiconductor layer 11 may include at least one of semiconductor materials such as InAlGaN, GaN, AlGaN, InGaN, AlN and InN, and may include a semiconductor layer doped with a first dopant such as Si, Ge, Sn, and the like.

However, the material constituting the first semiconductor layer 11 is not limited thereto, and the first semiconductor layer 11 may be formed of various materials.

The active layer 12 may be formed on the first semiconductor layer 11 and may be formed with a single or multiple quantum well structure. In an embodiment, the active layer 12 may emit light having a wavelength of 400 nm to 900 nm, and may have a double hetero structure. According to an example embodiment of the present invention, a cladding layer (not shown) doped with a dopant may be formed on and/or under the active layer 12. For example, the cladding layer may be formed of an AlGaN layer or an InAlGaN layer. In addition, materials such as AlGaN and AlInGaN may constitute the active layer 12, and various materials may constitute the active layer 12.

When an electric field of a certain (e.g., predetermined) voltage or more is applied to opposite ends of the light emitting element LD, the light emitting element LD emits light by forming electron-hole pairs in the active layer 12. The light emitting element LD may be used as a light source of any of various light emitting devices including the pixel of the display device by controlling light emitting of light emitting element LD using this principle.

The second semiconductor layer 13 may be provided on the active layer 12 and may include a semiconductor layer of a different type from the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, and InN, and may include a semiconductor layer doped with a second dopant, such as Mg. However, the material constituting the second semiconductor layer 13 is not limited thereto, and various materials may constitute the second semiconductor layer 13.

According to an embodiment of the present invention, the light emitting element LD may further include other phosphor layers, active layers, semiconductor layers, and/or electrode layers on and/or under each layer in addition to the first semiconductor layer 11, the active layer 12, and the second semiconductor layer 13 described above.

In an embodiment, the light emitting element LD may further include at least one electrode layer disposed on an end (e.g., an upper surface) of the second semiconductor layer 13 or on an end (e.g., a lower surface) of the first semiconductor layer 11. For example, the light emitting element LD may include an electrode layer 15 disposed on an end of the second semiconductor layer 13, as shown in FIG. 1B. In an embodiment, the electrode layer 15 may be an ohmic contact electrode, but is not limited thereto. In addition, the electrode layer 15 may include a metal or a metal oxide. For example, the electrode layer 15 may be formed by using alone or in combination chromium (Cr), titanium (Ti), aluminum (Al), gold (Au), nickel (Ni), ITO, and oxides or alloys thereof, but the present invention is not limited thereto. In addition, according to an embodiment, the electrode layer 15 may be substantially transparent or translucent. Accordingly, light generated from the light emitting element LD may be transmitted through the electrode layer 15 and emitted to the outside of the light emitting element LD.

In addition, the light emitting element LD may further include an insulating film 14. However, according to an embodiment of the present invention, the insulating film 14 may be omitted or may be provided to cover only a portion of the first semiconductor layer 11, the active layer 12, and the second semiconductor layer 13. For example, the insulating film 14 may be provided at a portion except for opposite ends of the light emitting element LD such that opposite ends of the light emitting element LD may be exposed.

For better understanding and ease of description, FIGS. 1A and 1B show a state in which a part of the insulating film 14 is removed, and, in an embodiment, all of side surface of the light emitting element LD may be actually surrounded by the insulating film 14.

According to an embodiment of the present invention, the insulating film 14 may include a transparent insulating material. For example, the insulating film 14 may include at least one insulating material of $SiO_2$, $Si_3N_4$, $Al_2O_3$, and $TiO_2$, but is not limited thereto. The insulating film 14 may include various insulating materials.

The insulating film 14 may prevent or substantially prevent an electric short which may occur when the active layer 12 contacts conductive materials other than the first semiconductor layer 11 and the second semiconductor layer 13. In addition, it is possible to improve the lifetime and the efficiency by forming the insulating film 14 to minimize or reduce surface defects of the light emitting element LD. In addition, when a plurality of light emitting elements LD are closely disposed, the insulating film 14 may prevent or substantially prevent unwanted shorting that may occur between light emitting elements LD.

The type, structure, shape, and the like of the light emitting element according to embodiments of the present invention may be variously changed.

Figure 2:
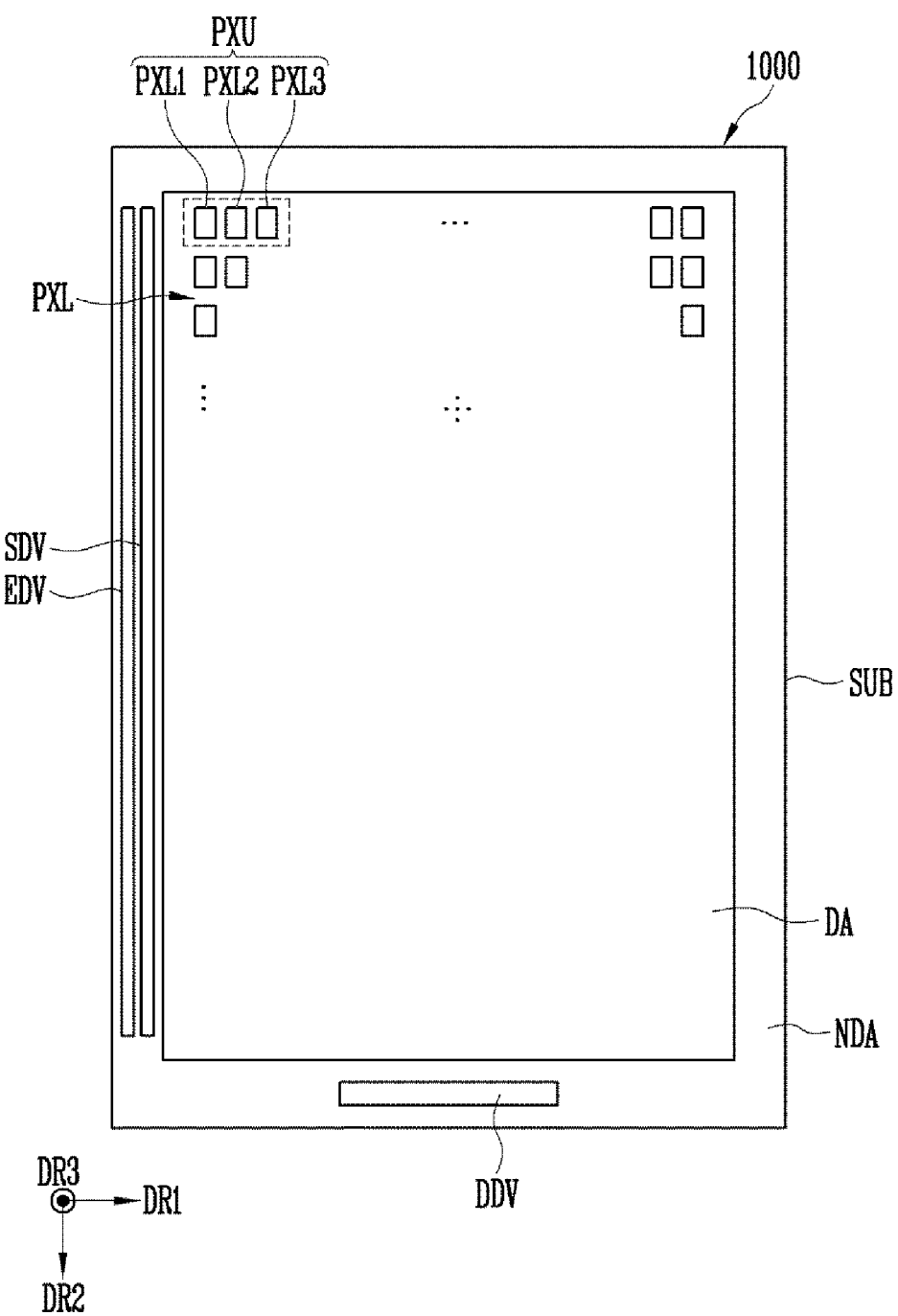
FIG. 2 is a top plan view schematically showing a display device according to an embodiment.

FIG. 2 is a top plan view schematically showing a display device according to an embodiment.

Referring to FIGS. 1A to 2, a display device 1000 may include a substrate SUB and a plurality of pixels PXL provided on the substrate SUB. The display device 1000 may include a display area DA in which an image is displayed and a non-display area NDA excluding the display area DA.

The display area DA may be an area where the pixels PXL are provided. The non-display area NDA may be an area where drivers for driving the pixels PXL and various lines (not shown) for connecting the drivers and the pixels PXL are provided.

The display area DA may have various shapes. For example, the display area DA may have any of various shapes, such as a closed polygon including sides consisting of a straight line, a circle, an ellipse, etc. including sides consisting of a curved line, and a semicircle, a semi-ellipse, etc. including sides consisting of a straight line and a curved line.

When the display area DA includes a plurality of areas, each area may also have various shapes, such as a closed polygon including sides of a straight line, a semicircle, a semi-ellipse, etc. including sides of a curved line, and an ellipse. In addition, a plurality of areas may have the same or different areas.

In an example embodiment of the present invention, a case in which the display area DA is provided as an area having a quadrangular shape including sides of a straight line will be described.

The non-display area NDA may be provided on at least one side of the display area DA. In an example embodiment of the present invention, the non-display area NDA may surround the display area DA.

The pixels PXL may be provided in the display area DA on the substrate SUB. Each of the pixels PXL may include at least one light emitting element LD driven by a corresponding scan signal and data signal.

The pixels PXL may include the light emitting element emitting white light and/or color light. Each of the pixels PXL may emit one of red, green, and blue colors, but is not limited thereto. For example, each of the pixels PXL may emit one of cyan, magenta, yellow, and white colors.

The pixels PXL may include a first pixel PXL1 emitting light of a first color, a second pixel PXL2 emitting light of a second color different from the first color, and a third pixel PXL3 emitting light of a third color different from the first color and the second color. At least one the first pixel PXL1, the second pixel PXL2, and the third pixel PXL3, which are disposed adjacent to each other, may constitute one pixel unit PXU capable of emitting light of various colors.

According to an embodiment, the first pixel PXL1 may be a red pixel emitting red light, the second pixel PXL2 may be a green pixel emitting green light, and the third pixel PXL3 may be a blue pixel emitting blue light. In an embodiment, the first pixel PXL1, the second pixel PXL2, and the third pixel PXL3 may emit light of the first color, the second color, and the third color, respectively, by including a light emitting element of the first color, a light emitting element of the second color, and a light emitting element of the third color as light sources. In another embodiment, the first pixel PXL1, the second pixel PXL2, and the third pixel PXL3 may emit light of the first color, the second color, and the third color, respectively, by including light emitting elements of the same color as each other and including light conversion layers of different colors disposed on each of the light emitting elements.

However, the color, type, and/or number of the pixels PXL constituting each pixel unit PXU are not particularly limited.

The pixels PXL may be provided in plural and arranged in rows and columns in a matrix form in a first direction DR1 and a second direction DR2 crossing the first direction DR1. However, the arrangement of the pixels PXL is not particularly limited, and may be arranged in various forms.

A driver may provide a signal to each of the pixels PXL through a line unit not shown, thereby controlling a driving of each of the pixels PXL. FIG. 2 omits the line unit for better understanding and ease of description.

The driver may include a scan driver SDV providing a scan signal to the pixels PXL through a scan line, an emission driver EDV providing an emission control signal to the pixels PXL through an emission control line, a data driver DDV providing a data signal to the pixels PXL through a data line, and a timing controller (not shown). The timing controller may control the scan driver SDV, the emission driver EDV, and data driver DDV.

In an embodiment, each of the pixels PXL may be formed of an active pixel. However, the type, structure, and/or driving method of the pixels PXL applicable to the present invention are not particularly limited.

Figure 3A:
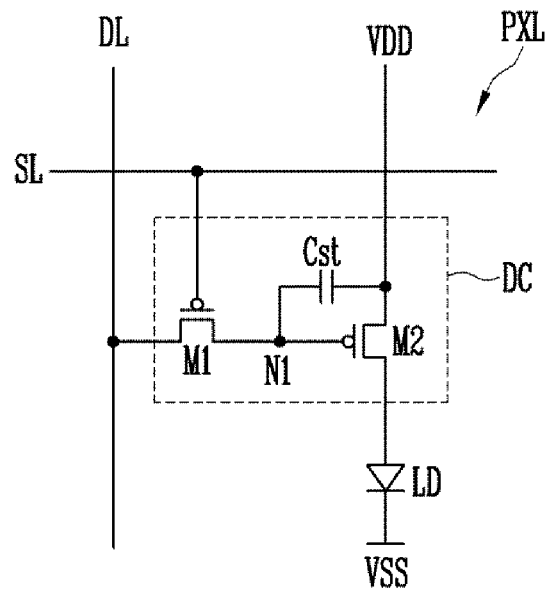
FIGS. 3A and 3B are circuit diagrams showing a pixel according to embodiments.
Figure 3B:
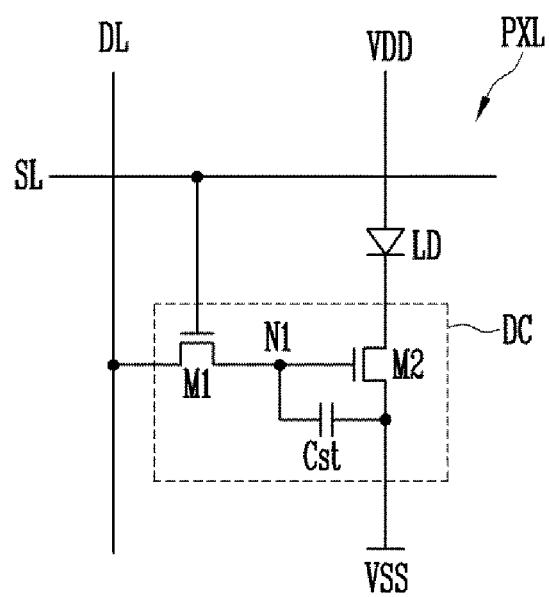

FIGS. 3A and 3B are circuit diagrams showing a pixel according to embodiments. Particularly, FIGS. 3A and 3B show an example of pixels constituting a light emitting display panel of an active type.

Referring to FIG. 3A, the pixel PXL may include at least one light emitting element LD and a pixel driving circuit DC connected to the light emitting element LD for driving the light emitting element LD.

A first electrode (e.g., anode) of the light emitting element LD may be connected to a first driving power supply VDD via the pixel driving circuit DC, and a second electrode (e.g., cathode) of the light emitting element LD may be connected to a second driving power supply VSS.

The first driving power supply VDD and the second driving power supply VSS may have different potentials. For example, the second driving power supply VSS may have a lower potential than the first driving power supply VDD by a threshold voltage or more of the light emitting element LD.

The light emitting element LD may emit light at a luminance corresponding to the driving current controlled by the pixel driving circuit DC.

FIG. 3A shows an example embodiment in which only one light emitting element LD is included in the pixel PXL, but the present invention is not limited thereto. For example, the pixel PXL may include a plurality of light emitting elements that are connected in parallel and/or in serial connected to each other.

According to an embodiment of the present invention, the pixel driving circuit DC may include a first transistor M1, a second transistor M2, and a storage capacitor Cst. However, the structure of the pixel driving circuit DC is not limited to an embodiment shown in FIG. 3A. According to an embodiment, the pixel PXL may further include a pixel sensing circuit (not shown). The pixel sensing circuit may measure a value of the driving current of each pixel PXL, and may transmit the measured value to an external circuit (e.g., timing controller) to compensate for each pixel PXL.

A first electrode of the first transistor M1 (or switching transistor) may be connected to a data line DL, and a second electrode thereof may be connected to a first node N1. Here, the first electrode and the second electrode of the first transistor M1 are different electrodes, and, for example, when the first electrode is a source electrode, the second electrode may be a drain electrode. The gate electrode of the first transistor M1 may be connected to a scan line SL.

The first transistor M1 may be turned on when a scan signal of a voltage (e.g., gate-on voltage) that may turn on the first transistor M1 from the scan line SL is provided, to electrically connect the data line DL and the first node N1. At this time, the data signal of the corresponding frame may be supplied to the data line DL, such that the data signal may be transferred to the first node N1. The data signal transferred to the first node N1 may be stored in the storage capacitor Cst.

A first electrode of a second transistor M2 (or driving transistor) may be connected to the first power supply VDD and a second electrode thereof may be electrically connected to the first electrode of the light emitting element LD (e.g. anode). The gate electrode of the second transistor M2 may be connected to the first node N1. The second transistor M2 may control an amount of driving current supplied to the light emitting elements LD in response to a voltage of the first node N1.

One electrode of the storage capacitor Cst may be connected to the first power supply VDD, and the other electrode thereof may be connected to the first node N1. Such a storage capacitor Cst may be charged with a voltage corresponding to the data signal supplied to the first node N1, and may maintain the charged voltage until the data signal of the next frame is supplied.

For better understanding and ease of description, FIG. 3A shows a driving circuit DC with a relatively simple structure including the first transistor M1 for transferring the data signal to the pixel PXL, the storage capacitor Cst for storing the data signal, and the second transistor M2 for supplying the driving current corresponding to the data signal to the light emitting element LD.

However, the present invention is not limited thereto, and the structure of the driving circuit DC may be variously modified. For example, the driving circuit DC may further include at least one transistor, such as a transistor for compensating for a threshold voltage of the second transistor M2, a transistor for initializing the first node N1, and/or a transistor for controlling a light emitting time of the light emitting element LD, and the like, and other circuit elements such as a boosting capacitor for boosting a voltage of the first node N1, and the like.

In addition, transistors included in the driving circuit DC, for example, first and second transistors M1 and M2 are all shown as P-type transistors in FIG. 3A, but the present invention is not limited thereto. That is, at least one of the first and second transistors M1 and M2 included in the driving circuit DC may be an N-type transistor.

For example, referring to FIG. 3B, the first and second transistors M1 and M2 of the driving circuit DC may be implemented as N-type transistors. The driving circuit DC shown in FIG. 3B may be similar to the driving circuit DC shown in FIG. 3A in configuration or operation except for a change of a connection position of some constituent elements due to a change in a type of a transistor. Therefore, a detailed description thereof will be omitted.

Figure 4:
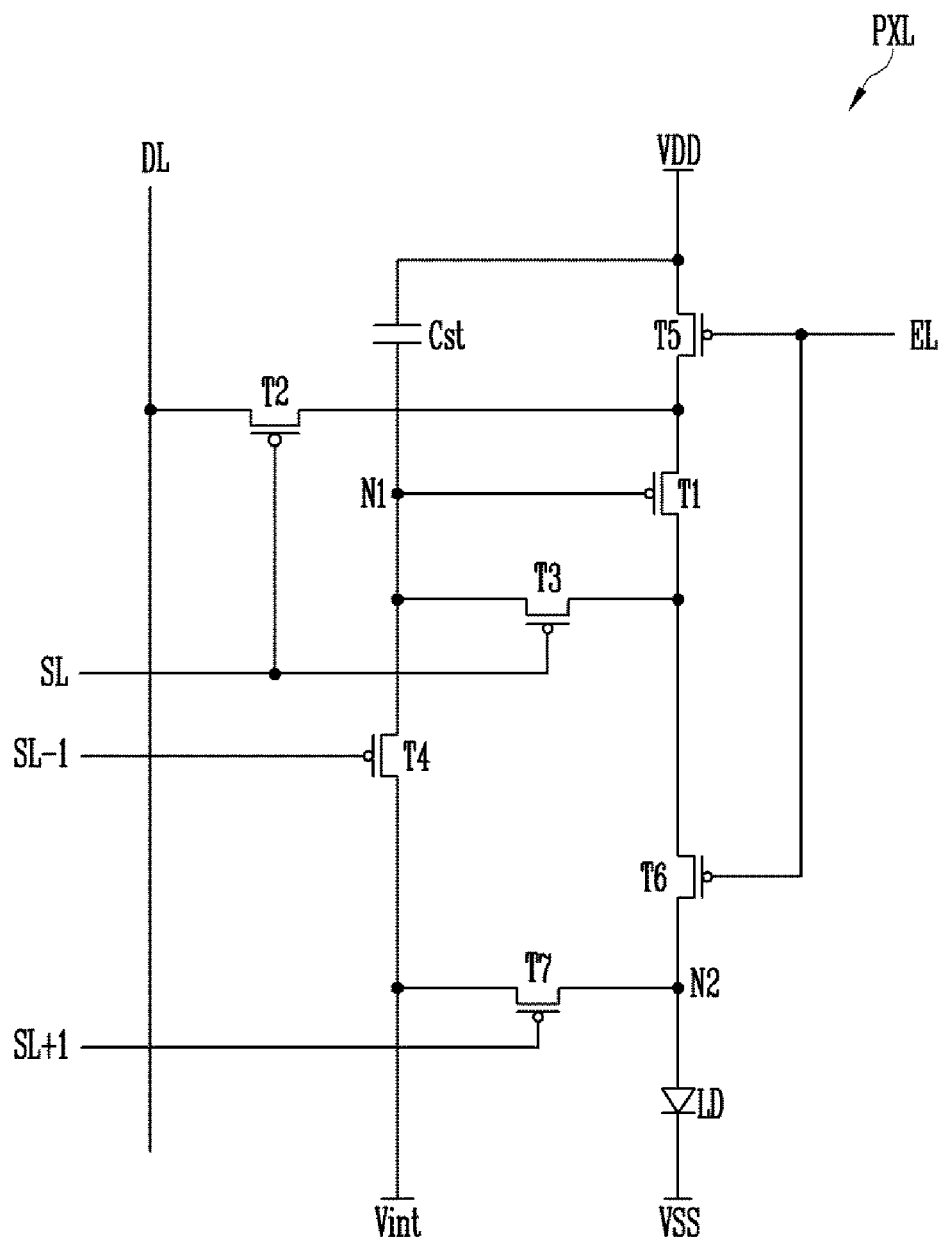
FIG. 4 is a circuit diagram showing a pixel according to another embodiment.

FIG. 4 is a circuit diagram showing a pixel according to another embodiment.

Referring to FIG. 4, the pixel PXL according to another embodiment of the present invention may include a light emitting element LD, first to seventh transistors T1, T2, T3, T4, T5, T6, and T7, and a storage capacitor Cst.

The first electrode (e.g., anode) of the light emitting element LD may be connected to the first transistor T1 via a sixth transistor T6, and the second electrode (e.g., cathode) of the light emitting element LD may be connected to the second driving power supply VSS. The light emitting element LD may emit light at a certain (e.g., predetermined) luminance corresponding to an amount of current supplied from the first transistor Ti.

One electrode of the first transistor T1 (or driving transistor) may be connected to the first driving power supply VDD via a fifth transistor T5, and the other electrode may be connected to the first electrode of the light emitting element LD via the sixth transistor T6. The first transistor T1 may control an amount of current flowing from the first driving power supply VDD to the second driving power supply VSS via the light emitting element LD corresponding to a voltage of the first node N1 which is a gate electrode.

The second transistor T2 (or switching transistor) may be connected between the data line DL and an electrode of the first transistor T1. The gate electrode of the second transistor T2 may be connected to the scan line SL. The second transistor T2 may be turned on when a scan signal of a gate-on voltage is supplied to the scan line SL, thereby electrically connecting the data line DL and an electrode of the first transistor Ti.

A third transistor T3 may be connected between another electrode of the first transistor T1 and the first node N1. A gate electrode of the third transistor T3 may be connected to the scan line SL. The third transistor T3 may be turned on when a scan signal of a gate-on voltage is supplied to the scan line SL, thereby electrically connecting another electrode of the first transistor T1 and the first node N1.

A fourth transistor T4 may be connected between the first node N1 and an initialization power supply Vint. A gate electrode of the fourth transistor T4 may be connected to a previous scan line SL-1. The fourth transistor T4 may be turned on when a scan signal of a gate-on voltage is supplied to the previous scan line SL-1, thereby supplying a voltage of the initialization power supply Vint to the first node N1.

Here, the initialization power supply Vint may be set to a lower voltage than the data signal.

The fifth transistor T5 may be connected between the first driving power supply VDD and an electrode of the first transistor Ti. A gate electrode of the fifth transistor T5 may be connected to an i-th emission control line EL. The fifth transistor T5 may be turned on when the emission control signal of a gate-on voltage is supplied to the i-th emission control line EL, and may be turned off in other cases.

The sixth transistor T6 may be connected between another electrode of the first transistor T1 and the first electrode of the light emitting element LD. A gate electrode of the sixth transistor T6 may be connected to the emission control line EL. The sixth transistor T6 may be turned on when an emission control signal of a gate-on voltage is supplied to the emission control line EL, and may be turned off in other cases.

A seventh transistor T7 may be connected between the initialization power supply Vint and the first electrode of the light emitting element LD. A gate electrode of the seventh transistor T7 may be connected to a next scan line SL+1. The seventh transistor T7 may be turned on when a scan signal of a gate-on voltage is supplied to the next scan line SL+1, thereby supplying a voltage of the initialization power supply Vint to the first electrode of the light emitting element LD.

The storage capacitor Cst may be connected between the first power supply VDD and the first node N1. The storage capacitor Cst may store a voltage corresponding to the data signal and the threshold voltage of the first transistor Ti.

The transistors included in the driving circuit DC, for example, the first to seventh transistors T1, T2, T3, T4, T5, T6, and T7 are all shown as P-type transistors in FIG. 4, but the present invention is not limited thereto. For example, at least one of the first to seventh transistors T1, T2, T3, T4, T5, T6, and T7 may be an N-type transistor.

Figure 5:
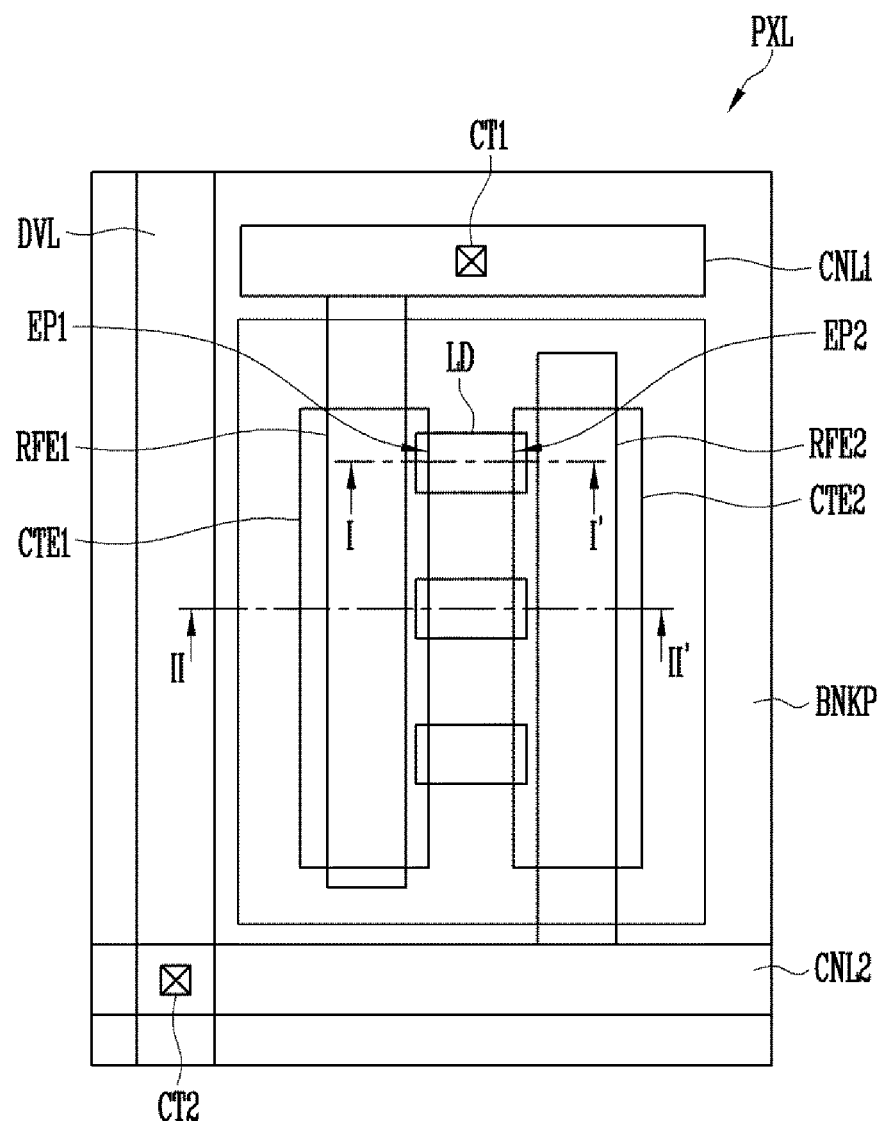
FIG. 5 is a top plan view of a pixel according to an embodiment.
Figure 6:
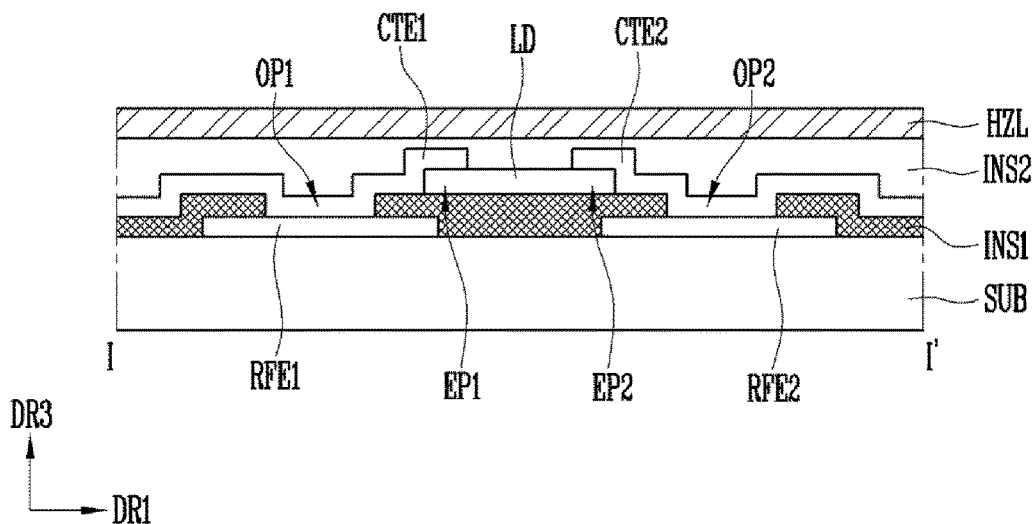
FIG. 6 is a schematic cross-sectional view of a pixel taken along the line I-I' of FIG. 5.
Figure 7A:
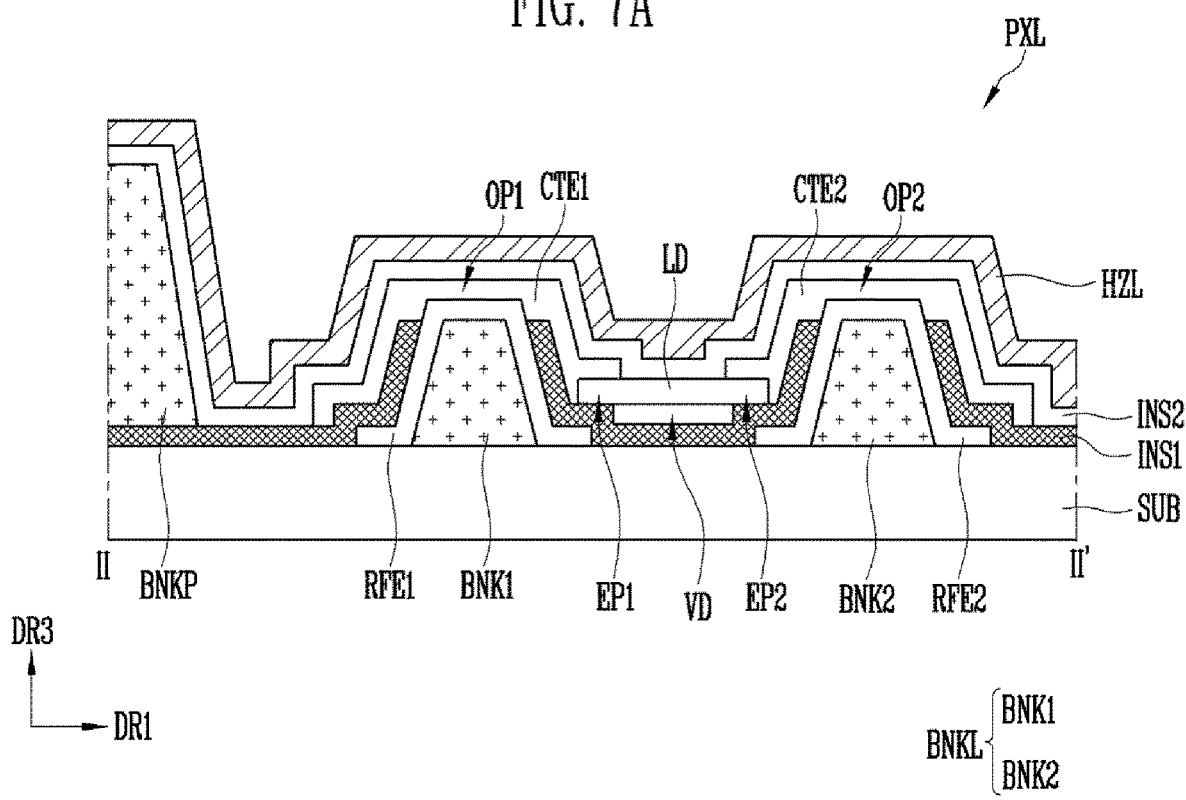
FIG. 7A is a cross-sectional view taken along the line II-II' of FIG. 5.
Figure 7B:
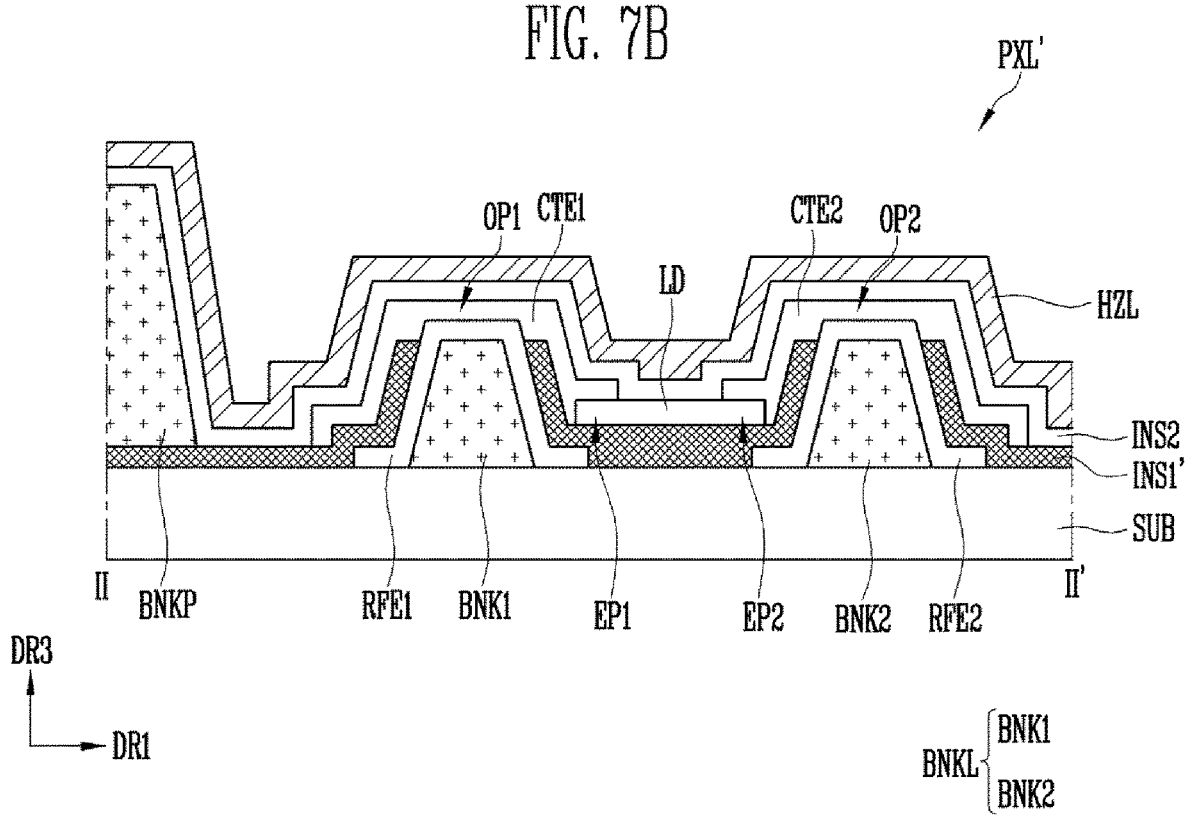
FIG. 7B is a cross-sectional view of another embodiment, taken along a line corresponding to the line II-II' of FIG. 5.

FIG. 5 is a top plan view of a pixel according to an embodiment; FIG. 6 is a schematic cross-sectional view of a pixel taken along the line I-I' of FIG. 5; and FIG. 7A is a cross-sectional view taken along the line II-II' of FIG. 5. FIG. 7B is a cross-sectional view of another embodiment, taken along a line corresponding to the line II-II' of FIG. 5.

Herein, for better understanding and ease of description, each electrode is shown as a single electrode layer, but the present invention is not limited thereto. In an embodiment of the present invention, "formed and/or provided in the same layer" may mean formed in the same process.

For better comprehension and ease of description, a plurality of light emitting elements LD are shown to be arranged in the first direction DR1 in FIG. 5, but the arrangement of the light emitting element LD is not limited thereto. For example, the light emitting element LD may be arranged in a diagonal direction between first and second electrodes RFE1 and RFE2.

Referring to FIGS. 1A to 7B, a display device according to an exemplary embodiment of the present invention may include a substrate SUB, a bank layer BNKL, first and second electrodes RFE1 and RFE2, a first insulating layer INS1, a light emitting element LD, third and fourth electrodes CTE1 and CTE2, a second insulating layer INS2, and a light diffusion layer HZL.

The substrate SUB may be a rigid substrate or a flexible substrate, and the material and physical properties thereof are not particularly limited. For example, the substrate SUB may be a hard substrate formed of glass or tempered glass, or a flexible substrate formed of a thin film of plastic or metallic material. In addition, the substrate SUB may be a transparent substrate, but is not limited thereto. For example, the substrate SUB may be a semi-transparent substrate, an opaque substrate, or a reflective substrate.

The bank layer BNKL may be provided on the substrate SUB. In an embodiment, the bank layer BNKL may include a first bank BNK1 and a second bank BNK2.

The first bank BNK1 and the second bank BNK2 may be provided on the substrate SUB. A space in which the light emitting element LD is disposed may be provided between the first bank BNK1 and the second bank BNK2. In an embodiment, the first bank BNK1 and the second bank BNK2 may be spaced apart from each other in the first direction DR1 on the substrate SUB beyond a length of the light emitting element LD.

The first bank BNK1 and the second bank BNK2 may be made of an insulating material including an organic material or an inorganic material, but the material of the first bank BNK1 and the second bank BNK2 is not limited thereto.

In an embodiment, the first bank BNK1 and the second bank BNK2 may have a trapezoidal shape whose sides are inclined at certain (e.g., predetermined) angles, but the shape of the first bank BNK1 and the second bank BNK2 is not limited thereto, and may be any of various shapes, such as a semi-ellipse, a circle, a quadrangle shape, and the like.

The first electrode RFE1 and the second electrode RFE2 may be disposed on the bank layer BNKL. In an embodiment, the first electrode RFE1 and the second electrode RFE2 may be provided on corresponding first and second banks BNK1 and BNK2, respectively. For example, the first electrode RFE1 may be provided on the first bank BNK1 and the second electrode RFE2 may be provided on the second bank BNK2.

In an embodiment, the first electrode RFE1 and the second electrode RFE2 may be disposed with a substantially uniform thickness along a surface of the first bank BNK1 and the second bank BNK2, and the first electrode RFE1 and the second electrode RFE2 may be provided to correspond to the shapes of the first bank BNK1 and the second bank BNK2. For example, the first electrode RFE1 may have a shape corresponding to a slope of the first bank BNK1, and the second electrode RFE2 may have a shape corresponding to a slope of the second bank BNK2.

The first electrode RFE1 and the second electrode RFE2 may be spaced apart from each other in the first direction DR1 with a light emitting element LD therebetween on the substrate SUB, and may be provided to extend in the second direction DR2 crossing the first direction DR1.

In an embodiment, the first electrode RFE1 may be disposed adjacent to the first end portion EP1 of each light emitting element LD, and may be electrically connected to each light emitting element LD through a third electrode CTE1 (or first contact electrode). The second electrode RFE2 may be disposed adjacent to the second end portion EP2 of each light emitting element LD, and may be electrically connected to each light emitting element LD through a fourth electrode CTE2 (or second contact electrode).

In an embodiment, the first electrode RFE1 and the second electrode RFE2 may be disposed on the same plane and may have the same height. For example, when the first electrode RFE1 and the second electrode RFE2 have the same height, one light emitting element LD may be more stably connected to each of the first electrode RFE1 and the second electrode RFE2.

The first electrode RFE1 and the second electrode RFE2 may be made of a conductive material. The conductive material may include any of metals, such as Ag, Mg, Al, Pt, Pd, Au, Ni, Nd, Ir, Cr, Ti, and alloys thereof.

In an embodiment, the first electrode RFE1 and the second electrode RFE2 may be formed of a single layer, but are not limited thereto, and may be formed of a multilayer. For example, the first electrode RFE1 and the second electrode RFE2 may further include a capping layer (not shown) made of a transparent conductive material. The capping layer may be disposed to cover the first electrode RFE1 and second electrode RFE2 to prevent or substantially prevent damage to the first and second electrodes RFE1 and RFE2 that may occur during a manufacturing process of the display device.

Here, a material of the first electrode RFE1 and the second electrode RFE2 is not limited to the materials described above. For example, the first electrode RFE1 and the second electrode RFE2 may be made of a conductive material with a certain (e.g., predetermined) reflectance. When the first electrode RFE1 and the second electrode RFE2 are made of a conductive material with a certain (e.g., predetermined) reflectance, the light emitted from opposite ends EP1 and EP2 of the light emitting element LD may proceed in a direction (e.g., a third direction DR3) in which the image is displayed.

In an embodiment, since the first electrode RFE1 and second electrode RFE2 has a shape corresponding to a shape of the first bank BNK1 and the second bank BNK2, the light emitted from opposite ends EP1 and EP2 of the light emitting elements LD may be reflected by the first electrode RFE1 and the second electrode RFE2 to further proceed to the third direction DR3. Therefore, an emission efficiency of the display device may be improved.

One of the first and second electrodes RFE1 and RFE2 may be an anode and the other electrode thereof may be a cathode. For example, the first electrode RFE1 may be the cathode and the second electrode RFE2 may be the anode. However, the present invention is not limited thereto, and the first electrode RFE1 may be an anode and the second electrode RFE2 may be a cathode.

For better understanding and ease of description, the first and second electrodes RFE1 and RFE2 are shown to be directly provided on the substrate SUB, but are not limited thereto. For example, a constituent element may be further provided for driving the display device as a passive matrix or active matrix between the first and second electrodes RFE1 and RFE2 and the substrate SUB.

In an embodiment, the first electrode RFE1 may be connected to a first connecting line CNL1, and the second electrode RFE2 may be connected to a second connecting line CNL2. According to an example embodiment, the first connecting line CNL1 may be provided integrally with the first electrode RFE1, and the second connecting line CNL2 may be provided integrally with the second electrode RFE2.

The first connecting line CNL1 may be electrically connected to a first power line (not shown) through a first hole CT1. The second connecting line CNL2 may be electrically connected to a second power line DVL through a second hole CT2. The light emitting element LD may emit light in response to a driving signal applied through the first connecting line CNL1 and the second connecting line CNL2.

Referring to FIG. 3A, the first electrode RFE1 and the second electrode RFE2 may be electrically connected to the driving circuit DC or the second driving power supply VSS through the first connecting line CNL1 and the second connecting line CNL2. The first electrode RFE1 may be electrically connected to the second driving power supply VSS, and the second electrode RFE2 may be electrically connected to the driving circuit DC. The first electrode RFE1 and the second electrode RFE2 may be connected to the first end portion EP1 and the second end portion EP2 of the light emitting element LD to provide a driving signal to the light emitting element LD, and the light emitting element LD may emit light of a certain (e.g., predetermined) luminance in response to the driving current provided from the driving circuit DC.

The first insulating layer INS1 may be provided on the first electrode RFE1 and the second electrode RFE2. In an embodiment, the first insulating layer INS1 is provided entirely on the substrate SUB to cover the first and second banks BNK1 and BNK2 and the first and second electrodes RFE1 and RFE2 described above. In addition, the first insulating layer INS1 may be disposed along a surface of the substrate SUB in which the first and second banks BNK1 and BNK2 and the first and second electrodes RFE1 and RFE2 are not disposed.

The first insulating layer INS1 may be provided between the substrate SUB and each of the light emitting elements LD. In an example embodiment, the first insulating layer INS1 may be an inorganic insulating layer made of an inorganic material. In an embodiment, the first insulating layer INS1 may be disposed with a substantially uniform thickness along the surface of the substrate SUB and the first and second electrodes RFE1 and RFE2, and a spacing or space VD may be defined between the first insulating layer INS1 and the light emitting element LD.

In some embodiments, the first insulating layer INS1 may include an organic insulating layer made of an organic material. As shown in FIG. 7B, each pixel PXL' may include a first insulating layer INS1' including an organic insulating layer. In an embodiment, the first insulating layer INS1' may fill a space between the substrate SUB and the light emitting element LD to stably support the light emitting element LD.

In an embodiment, the first insulating layer INS1 may include a first opening OP1 and a second opening OP2. The first opening OP1 and the second opening OP2 may expose at least a portion of the first electrode RFE1 and the second electrode RFE2.

The first and second openings OP1 and OP2 may be formed on the corresponding first and second banks BNK1 and BNK2, respectively. For example, the first opening OP1 may be formed on the first bank BNK1, and the second opening OP2 may be formed on the second bank BNK2.

The first opening OP1 and the second opening OP2 may have a thickness and/or depth corresponding to a thickness of the first insulating layer INS1. That is, the first opening OP1 and the second opening OP2 may completely pass through the first insulating layer INS1 in the corresponding region. Thus, the first and second electrodes RFE1 and RFE2 may be exposed to the outside to contact third and fourth electrodes CTE1 and CTE2 described below.

The third electrode CTE1 and the fourth electrode CTE2 may be provided on the first insulating layer INS1 and the light emitting element LD.

The third electrode CTE1 and the fourth electrode CTE2 may be partially overlapped with one of opposite ends EP1 and EP2 of each of the light emitting elements LD. For example, the third electrode CTE1 may be partially overlapped with the first end portion EP1 of each of the light emitting elements LD, and the fourth electrode CTE2 may be partially overlapped with the second end portion EP2 of each of the light emitting elements LD.

The third electrode CTE1 may cover the first electrode RFE1 and overlap with the first electrode RFE1 in a plane view. The third electrode CTE1 may be electrically connected to the first electrode RFE1 through the first opening OP1 of the first insulating layer INS1.

The fourth electrode CTE2 may cover the second electrode RFE2 and overlap with the second electrode RFE2 in a plane view. The fourth electrode CTE2 may be electrically connected to the second electrode RFE2 through the second opening OP2 of the first insulating layer INS1.

Each of the third and fourth electrodes CTE1 and CTE2 may be made of a transparent conductive material. For example, the transparent conductive material may include ITO, IZO, ITZO, and the like. When the third and fourth electrodes CTE1 and CTE2 are made of a transparent conductive material and light emitted from the light emitting element LD proceeds in the third direction DR3, a loss may be reduced. However, the materials of third and fourth electrodes CTE1 and CTE2 are not limited to the materials described above.

In an embodiment, the third and fourth electrodes CTE1 and CTE2 may be provided on the same plane. In an embodiment, the third and fourth electrodes CTE1 and CTE2 may be formed concurrently (e.g., simultaneously). However, the present invention is not limited thereto, and, in an embodiment, the third and fourth electrodes CTE1 and CTE2 may be provided on different planes. In an embodiment, an insulating pattern may be further disposed on one of the third and fourth electrodes CTE1 and CTE2, and the other electrode thereof may be disposed on the insulating pattern.

A bank pattern BNKP may be provided on the substrate SUB. In an embodiment, the bank pattern BNKP may be disposed on the first insulating layer INS1. In another embodiment, the bank pattern BNKP may be directly disposed on the substrate SUB to contact the substrate SUB.

In an embodiment, the bank pattern BNKP may be disposed along a boundary of each pixel PXL in a plane view. In other words, the light emitting element LD may be surrounded by the bank pattern BNKP disposed along the boundary of each pixel PXL, and each pixel PXL may be defined by the bank pattern BNKP. In an embodiment, the bank pattern BNKP may be integrally connected and disposed as shown in FIG. 5.

In an embodiment, the bank pattern BNKP may have a cross-section of a trapezoidal shape that is narrower upwards, such as the first bank BNK1 and the second bank BNK2, but is not limited thereto. In another embodiment, the bank pattern BNKP may have a curved surface having a cross-section such as a semicircular or semi-elliptical shape narrower upwards. However, in an embodiment of the present invention, the shape and/or inclination of the bank pattern BNKP is not particularly limited, and may be variously modified.

The bank pattern BNKP may prevent or substantially prevent light leakage from occurring between adjacent pixels PXL. In addition, the bank pattern BNKP may prevent or substantially prevent a solution including the light emitting element LD from leaking to the adjacent pixel during the alignment of the light emitting element LD.

The second insulating layer INS2 may be provided on the third electrode CTE1 and the fourth electrode CTE2. The second insulating layer INS2 may prevent or substantially prevent the third electrode CTE1 and the fourth electrode CTE2 from being exposed to the outside, thereby preventing or substantially preventing the third electrode CTE1 and the fourth electrode CTE2 from corroding. The second insulating layer INS2 may also function as a sealing layer to prevent or substantially prevent oxygen and moisture from penetrating into the light emitting element LD.

The second insulating layer INS2 may include an inorganic insulating layer made of an inorganic material or an organic insulating layer made of an organic material. The second insulating layer INS2 may be formed of a single layer as shown in the drawing, but is not limited thereto, and may be formed of multiple layers.

In some embodiments, an overcoat layer (not shown) may be further provided on the second insulating layer INS2. The overcoat layer may be a planarization layer that alleviates steps generated by various structures disposed thereunder.

The light diffusion layer HZL may be disposed on the second insulating layer INS2.

Figure 8:
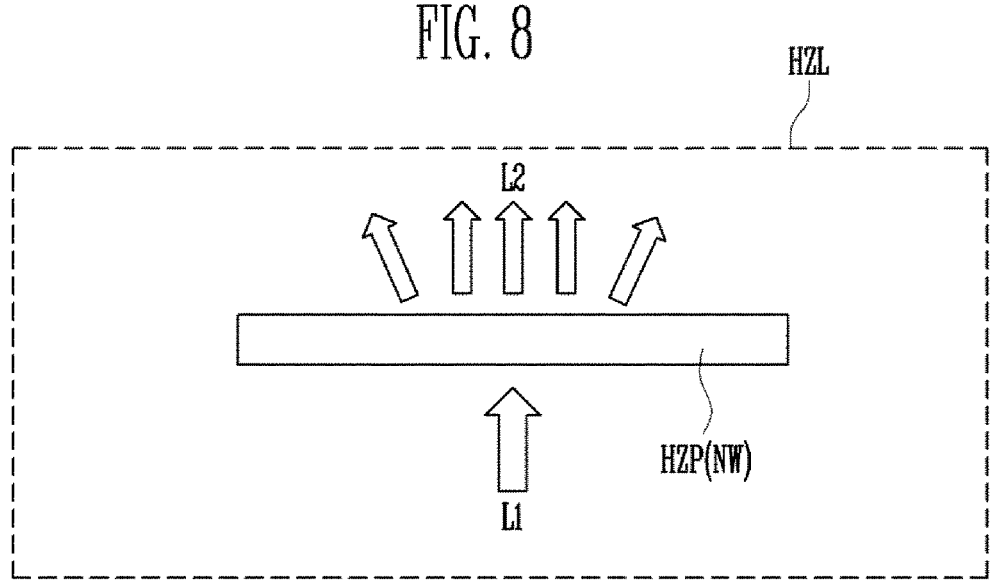
FIG. 8 is an enlarged cross-sectional view of a portion of a light diffusion layer according to an embodiment.
Figure 9:
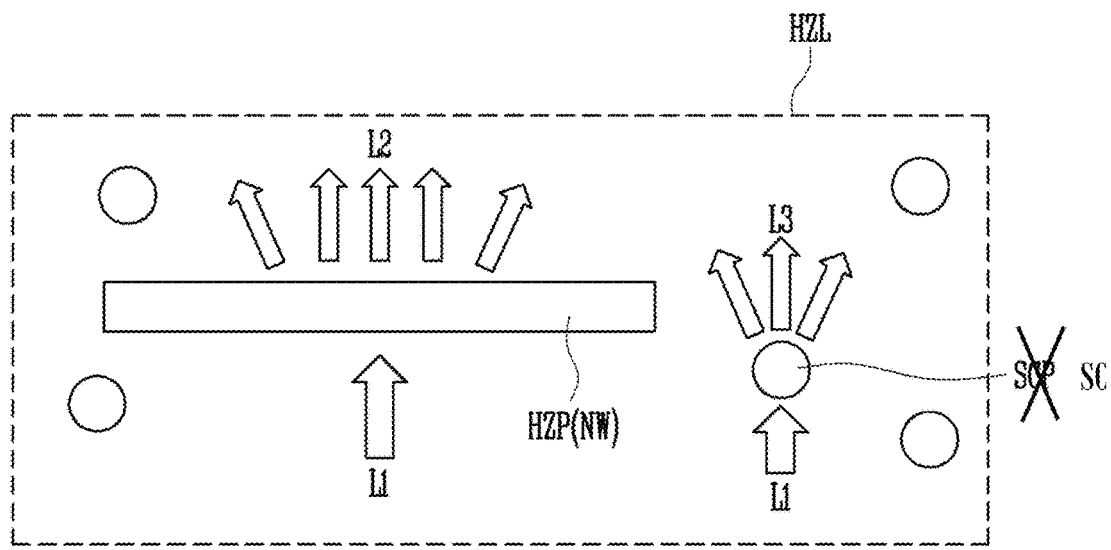
FIG. 9 is an enlarged cross-sectional view of a portion of a light diffusion layer according to another embodiment.

The light diffusion layer HZL may be a layer including light diffusion particles for diffusion of light. The light emitted from the light emitting element LD may be diffused by the light diffusion layer HZL to be uniformly emitted to the outside of the pixel as a whole. Referring further to FIGS. 8 and 9, a further detailed description of the light diffusion layer HZL is provided.

FIG. 8 is an enlarged cross-sectional view of a portion of a light diffusion layer according to an embodiment; and FIG. 9 is an enlarged cross-sectional view of a portion of a light diffusion layer according to another embodiment.

Referring further to FIGS. 8 and 9 in addition to FIG. 7A, the light diffusion layer HZL may include at least one type of light diffusion particle HZP.

For example, the light diffusion layer HZL may include a plurality of light diffusion particles HZP dispersed in a certain (e.g., predetermined) matrix material, such as a transparent resin. In an embodiment, the light diffusion layer HZL may include the light diffusion particle HZP, such as a nanowire (NW). The constituting material of the nanowire (NW) included in the light diffusion layer HZL may be, for example, silver (Ag), gold (Au), carbon (C), nickel (Ni), and the like, but is not particularly limited.

The light diffusion particle HZP may diffuse at least some of the transmitted light. For example, light emitted from the light emitting element LD may transmit through the light diffusion layer HZL. An optical waveguide may be formed inside the light diffusion particle HZP, and an incident light L1 may be diffused in various directions inside the light diffusion particle HZP. The diffused light may be emitted in various directions as diffused light L2 from a surface of the light diffusion particle HZP. In other words, the incident light L1 emitted from the light emitting element LD, which is a point light source, may be diffused by the light diffusion particle HZP, and may be emitted in various directions along the surface of the light diffusion particle HZP like light emitted from a planar light source.

In an embodiment, when the light diffusion layer HZL includes a metal nanowire, the light diffusion layer HZL may function as a conductive layer. For example, when the light diffusion layer HLZ is directly disposed on the third electrode CTE1 and the fourth electrode CTE2, a short may occur due to the light diffusion layer HLZ. Thus, the light diffusion layer HZL may be disposed on the second insulating layer INS2, and may be isolated from other constituent elements by the second insulating layer INS2.

In some embodiments, the light diffusion layer HZL may further include a light scattering particle SCP as shown in FIG. 9.

The light scattering particle SCP may form optical interfaces with matrix materials with different refractive indices from matrix materials constituting the light diffusion layer HZL. The light scattering particle SCP is not particularly limited as long as it is a material capable of scattering at least some of transmitted light. For example, the light scattering particle SCP may include oxide particles, such as titanium oxide (TiO$_2$), aluminum oxide (Al$_2$O$_3$), indium oxide (In$_2$O$_3$), zinc oxide (ZnO), tin oxide (SnO$_2$), and silica.

As described above, the light diffusion layer HZL may be disposed on the light emitting element LD. The light diffusion layer HZL may diffuse the light emitted from the light emitting element LD and may emit uniform light as a whole. That is, the light diffusion layer HZL may improve uniformity of light emitted from each pixel PXL.

In addition, when the light diffusion layer HZL is disposed on the second insulating layer INS2, the light diffusion layer HZL may transmit some of light that is totally reflected by a refractive index difference between the second insulating layer INS2 and air and is not emitted to the outside. That is, the light diffusion layer HZL may improve the transmittance of the constituted elements disposed on the light emitting element LD, thereby improving a display luminance of the display device.

The display device according to an embodiment of the present invention may directly form the light diffusion layer HZL on the second insulating layer INS2 without a separate light diffusion member, such as a light diffusion film or a light diffusion sheet. As a result, a thickness of the display device may be made thinner.

Herein, further embodiments of the pixel will be described. In the following embodiments, the same components as those of the previous embodiments are denoted by the same reference numerals, and the description thereof may be omitted or simplified.

Figure 10:
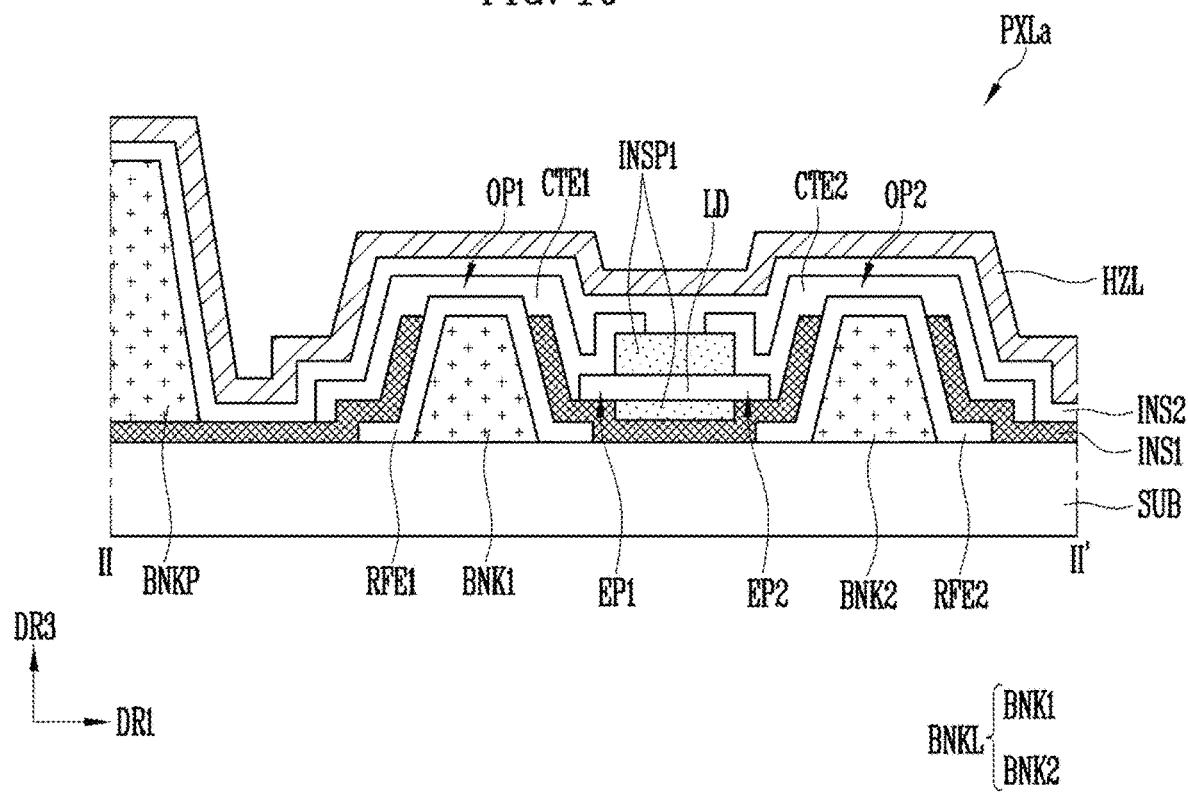
FIGS. 10 to 12 are cross-sectional views of a pixel according to various embodiments, taken along a line corresponding to the line II-II' of FIG. 5.
Figure 11:
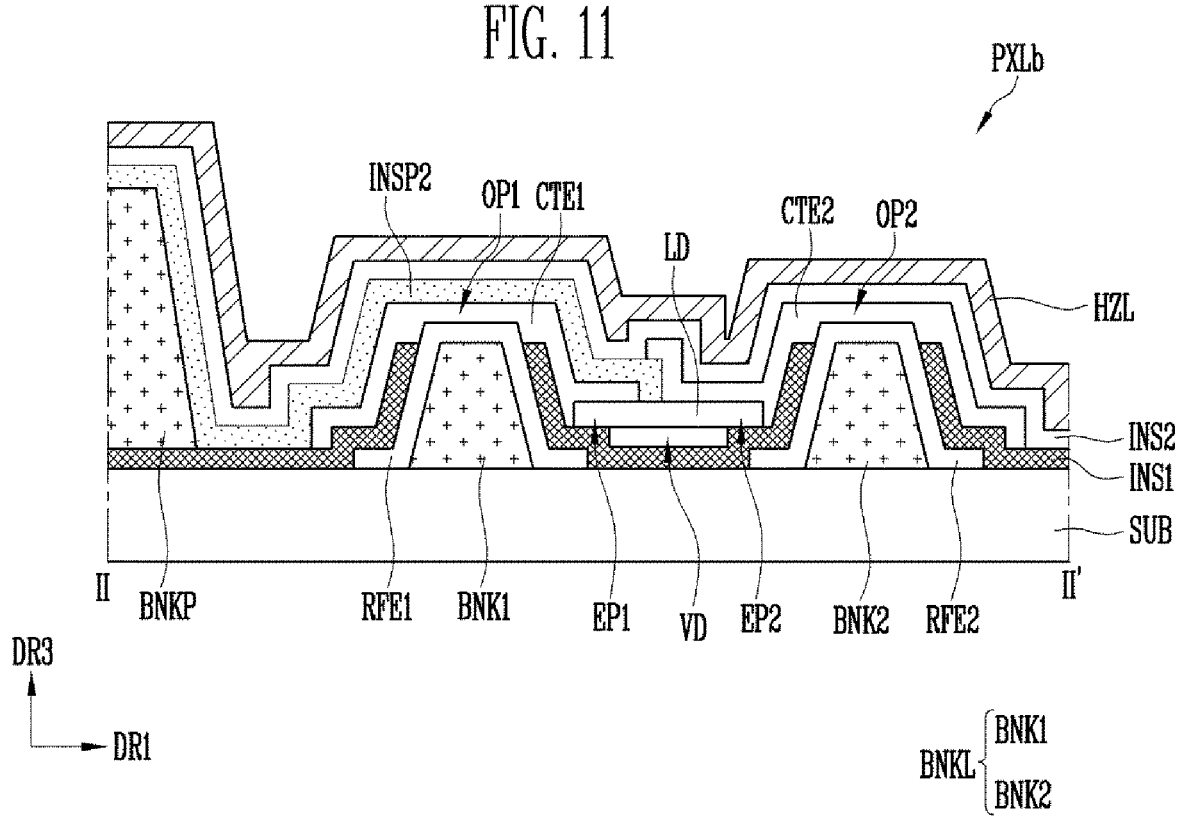
Figure 12:
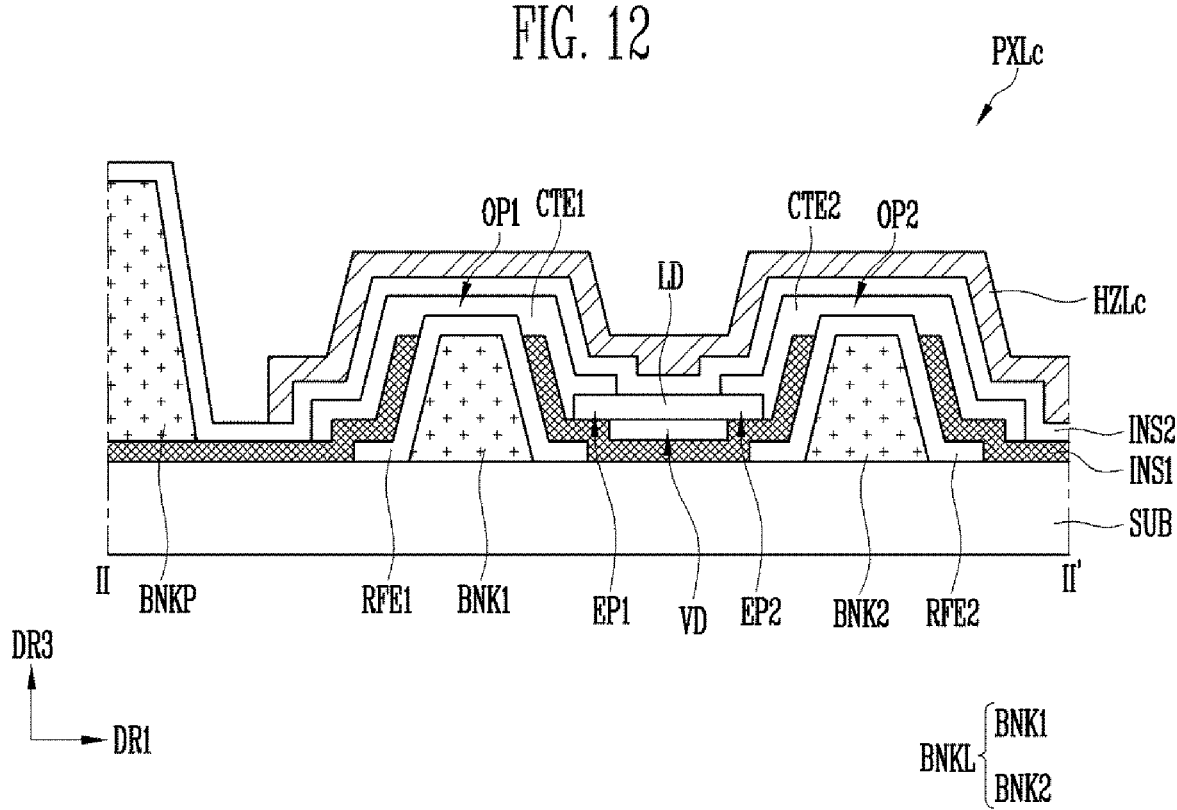

FIGS. 10 to 12 are cross-sectional views of a pixel according to various embodiments, taken along a line corresponding to the line II-II' of FIG. 5.

Referring to FIG. 10, in an embodiment, a first insulating pattern INSP1 may be further disposed on the light emitting element LD.

The first insulating pattern INSP1 may be disposed on the light emitting element LD, particularly the light emitting element LD aligned between the first and second electrodes RFE1 and RFE2, and may expose the first and second end portions EP1 and EP2 of the light emitting element LD. For example, the first insulating pattern INSP1 may be partially disposed on one area, including a central area of the light emitting element LD, without covering the first and second end portions EP1 and EP2 of the light emitting element LD. The first insulating pattern INSP1 may be formed with an independent pattern, but is not limited thereto.

The first insulating pattern INSP1 may stably fix the light emitting element LD. For example, by forming the first insulating pattern INSP1 on the light emitting element LD after an alignment of the light emitting element LD is completed, it is possible to prevent or substantially prevent the light emitting element LD from deviating from an aligned position.

For example, the first insulating pattern INSP1 may include an organic insulating layer made of an organic material.

When there is the space VD (see FIG. 7A) between the first insulating layer INS1 and the light emitting element LD before forming the first insulating pattern INSP1, the space VD may be filled in the process of forming the first insulating pattern INSP1. Accordingly, the light emitting element LD may be more stably supported.

Referring to FIG. 11, in an embodiment, a second insulating pattern INSP2 may be further disposed on the third electrode CTE1.

In an embodiment, the second insulating pattern INSP2 may be directly disposed on the third electrode CTE1 to cover the third electrode CTE1. For example, the second insulating pattern INSP2 may be disposed on a region including the first end portion EP1 of the light emitting element LD and on the third electrode CTE1, and may cover an end of the third electrode CTE1 on the light emitting element LD.

The second insulating pattern INSP2 may be interposed between the third electrode CTE1 and the fourth electrode CTE2, thereby stably isolating the third and fourth electrodes CTE1 and CTE2. That is, by forming the second insulating pattern INSP2, short defects capable of occurring between third and fourth electrodes CTE1 and CTE2 may be effectively prevented. The second insulating pattern INSP2 may be formed on a portion of the light emitting element LD so as not to cover the second end portions EP2 of the light emitting element LD.

Referring to FIG. 12, in an embodiment, a light diffusion layer HZLc may be disposed only on a portion of the second insulating layer INS2, such as not to be entirely disposed on the second insulating layer INS2. That is, the light diffusion layer HZLc may be patterned and disposed on the second insulating layer INS2.

For example, the light diffusion layer HZLc may be disposed to overlap with the light emitting element LD, and may be disposed not to overlap with the bank pattern BNKP surrounding the light emitting element LD.

When the light diffusion layer HZLc may be patterned and disposed, a color mixture between adjacent pixels may be prevented or substantially prevented. Particularly, when the light diffusion layer HZLc is not disposed on the bank pattern BNKP disposed at a boundary of each pixel PXLc, the light emitted from the light emitting element LD may be prevented or substantially prevented from being diffused and emitted to an adjacent pixel through the light diffusion layer HZLc. Therefore, the color mixture between adjacent pixels may be prevented or substantially prevented.

Herein, a pixel unit consisting of a plurality of pixels will be described. The pixel unit may include a light conversion layer that converts light emitted from the light emitting element. The structure of each pixel included in the pixel unit may be similar to or the same as that described above, and the same components are denoted by the same reference numerals, and the description thereof may be omitted or simplified.

Figure 13:
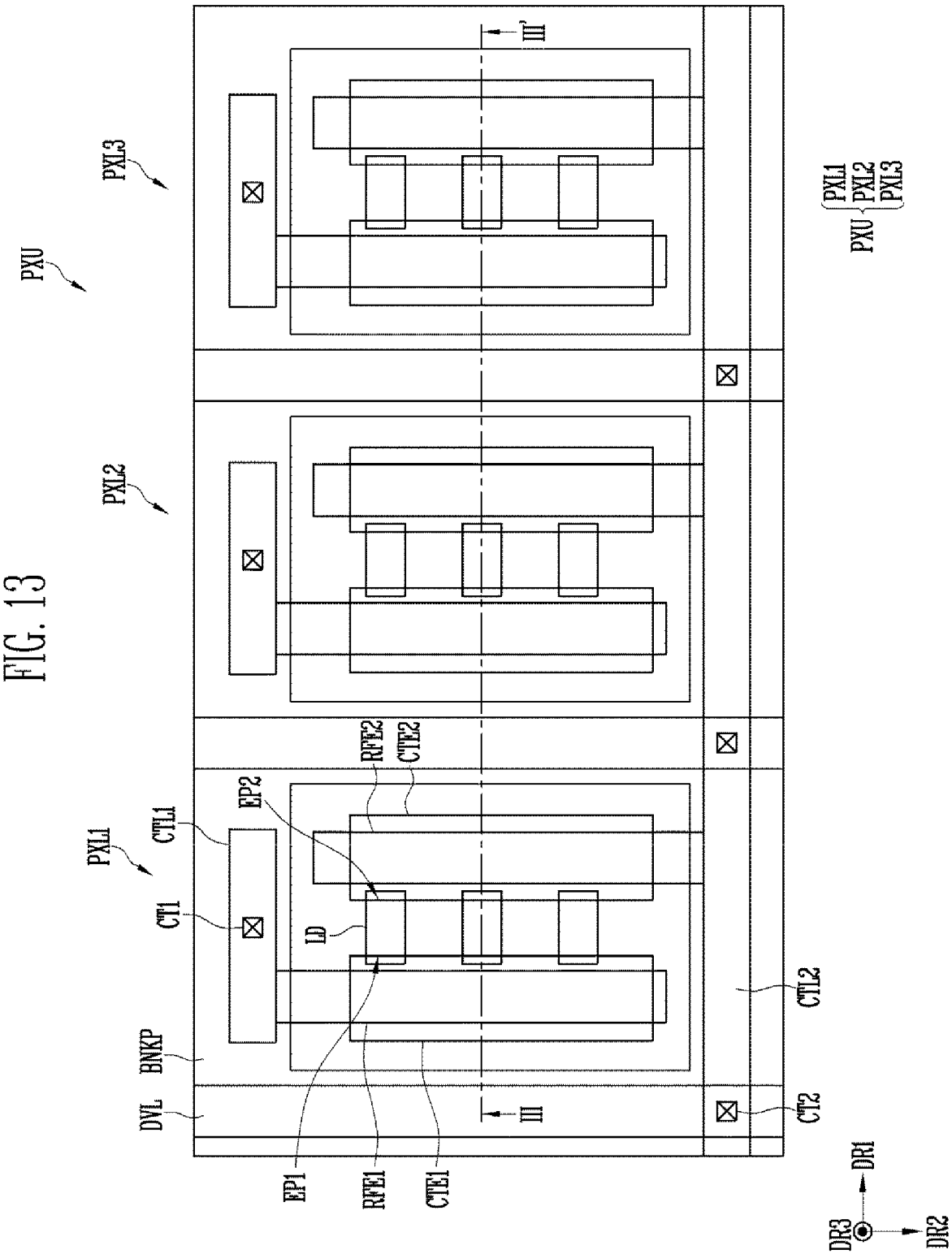
FIG. 13 is a top plan view of a pixel unit according to an embodiment.
Figure 14:
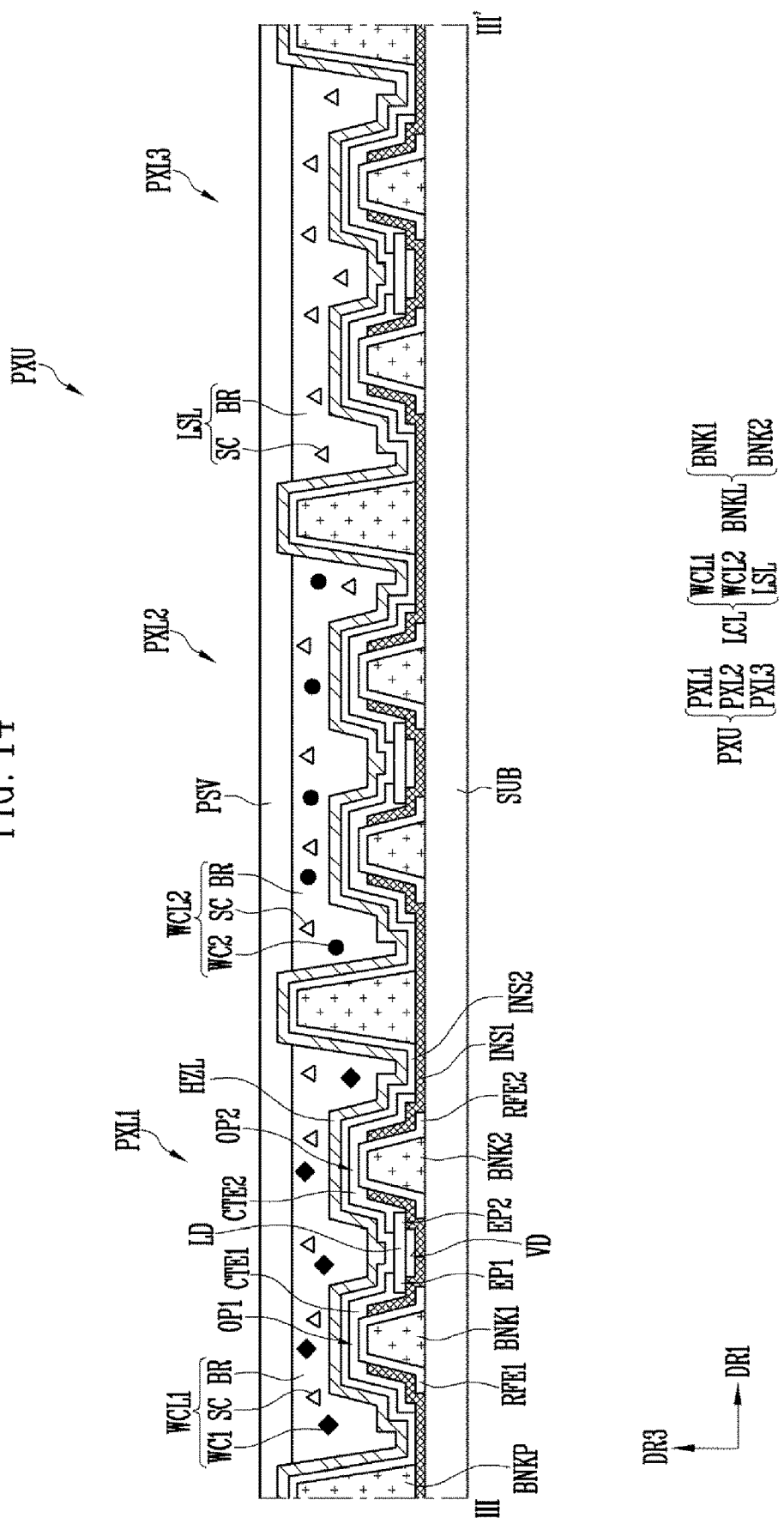
FIG. 14 is a cross-sectional view taken along the line III-III' of FIG. 13.
Figure 15:
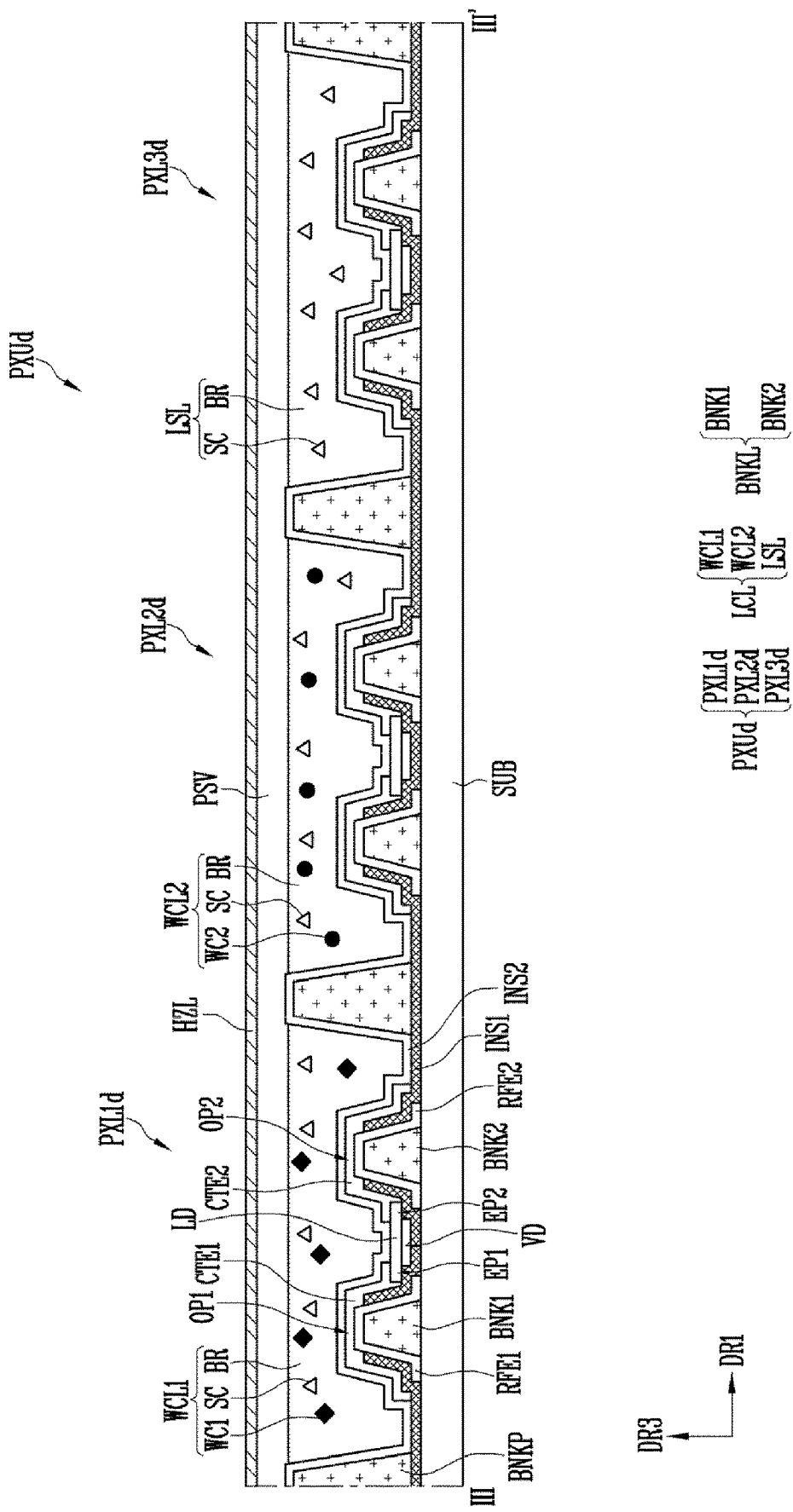
FIG. 15 is a cross-sectional view showing an embodiment in which a light diffusion layer of FIG. 14 is disposed on a light conversion layer, taken along a line corresponding to the line III-III' of FIG. 13.
Figure 16:
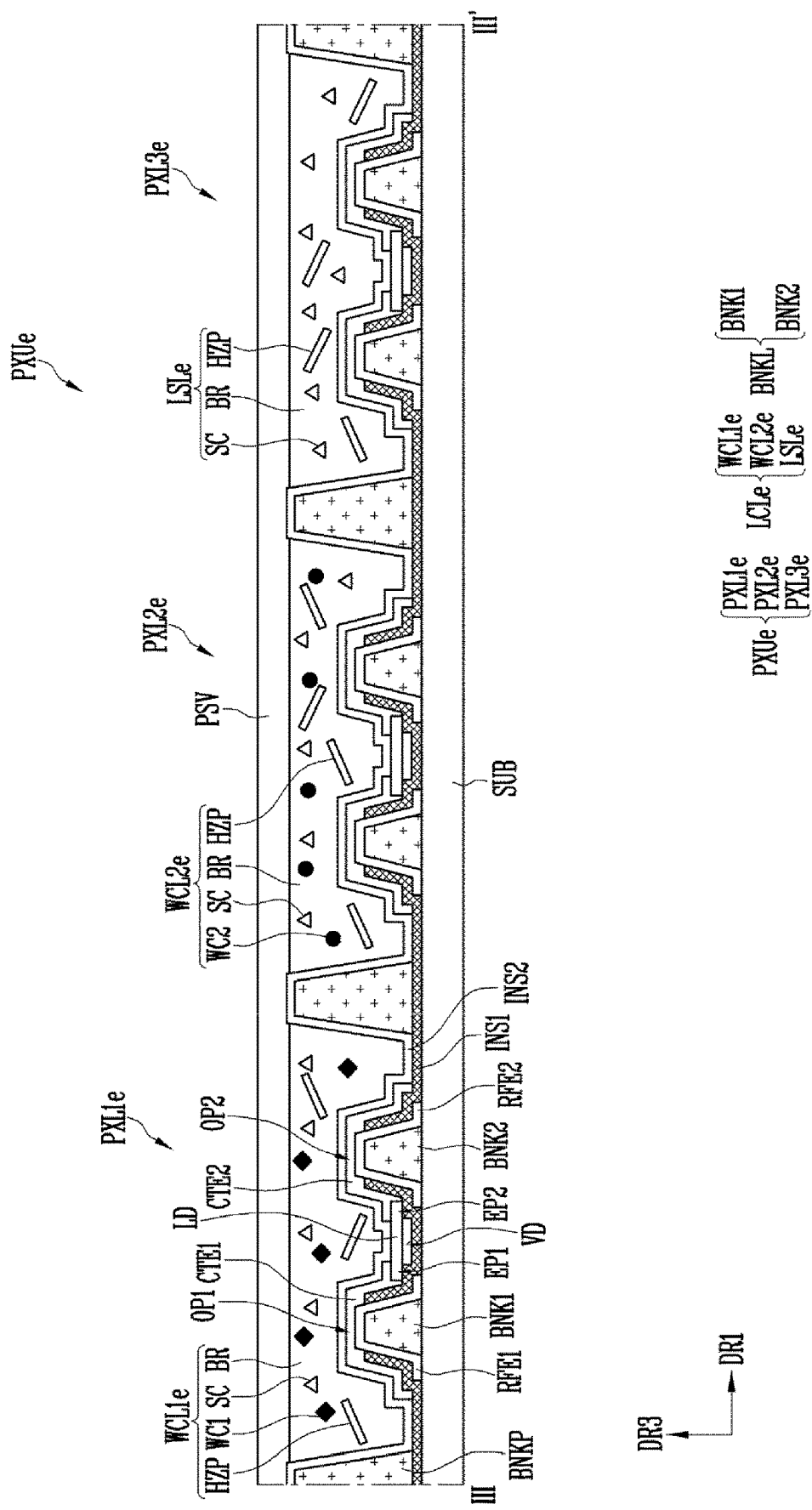
FIG. 16 is a cross-sectional view of an embodiment in which a light diffusion layer of FIG. 14 is not disposed and a light conversion layer includes a light diffusion particle, taken along a line corresponding to the line III-III' of FIG. 13.

FIG. 13 is a top plan view of a pixel unit according to an embodiment; and FIG. 14 is a cross-sectional view taken along the line III-III' of FIG. 13. FIG. 15 is a cross-sectional view showing an embodiment in which a light diffusion layer of FIG. 14 is disposed on a light conversion layer, taken along a line corresponding to the line III-III' of FIG. 13. FIG. 16 is a cross-sectional view showing an embodiment in which a light diffusion layer of FIG. 14 is not disposed and a light conversion layer includes a light diffusion particle, taken along a line corresponding to the line III-III' of FIG. 13.

Referring to FIGS. 13 and 14, the pixel unit PXU may include a first pixel PXL1, a second pixel PXL2, and a third pixel PXL3 arranged sequentially.

As described above, the first pixel PXL1 may emit light of the first color, the second pixel PXL2 may emit light of the second color, and the third pixel PXL3 may emit light of the third color. The bank pattern BNKP may be disposed at the boundaries of the first to third pixels PXL1, PXL2, and PXL3, and the first to third pixels PXL1, PXL2, and PXL3 may be separated from each other by the bank pattern BNKP.

The pixel unit PXU may include a light conversion layer LCL disposed on each light emitting element LD. In an embodiment, the light conversion layer LCL may be disposed on the light diffusion layer HZL.

The light conversion layer LCL may include a first wavelength conversion layer WCL1, a second wavelength conversion layer WCL2, and a light scattering layer LSL. The first pixel PXL1 may include the first wavelength conversion layer WCL1, the second pixel PXL2 may include the second wavelength conversion layer WCL2, and the third pixel PXL3 may include the light scattering layer LSL.

Each of the first wavelength conversion layer WCL1, the second wavelength conversion layer WCL2, and the light scattering layer LSL may include a base resin BR and various particles dispersed inside the base resin BR.

In an embodiment, the first wavelength conversion layer WCL1 may include a first wavelength conversion particle WC1 dispersed inside the base resin BR, the second wavelength conversion layer WCL2 may include a second wavelength conversion particle WC2 dispersed inside the base resin BR, and the light scattering layer LSL may include a light scattering particle SC dispersed inside the base resin BR. In an embodiment, the first wavelength conversion layer WCL1 and the second wavelength conversion layer WCL2 may further include the light scattering particle SC dispersed inside the base resin BR.

The base resin BR is not particularly limited as long as it is a material having a high light transmittance and an excellent dispersion characteristic for the first wavelength conversion particle WC1, the second wavelength conversion particle WC2, and the light scattering particle SC. For example, the base resin BR may include an organic material, such as an epoxy resin, an acrylic resin, a cardo resin, an imide resin, and the like.

The first wavelength conversion particle WC1 of the first wavelength conversion layer WCL1 and the second wavelength conversion particle WC2 of the second wavelength conversion layer WCL2 may convert a peak wavelength of incident light into another specific peak wavelength. That is, the first wavelength conversion particle WC1 and the second wavelength conversion particle WC2 may convert a color of the incident light.

For example, the light emitting element LD may emit blue light, and the first wavelength conversion particle WC1 may convert blue light provided from the light emitting element LD into red light and may emit the red light. In addition, the second wavelength conversion particle WC2 may convert blue light provided from the light emitting element LD into green light and emit the green light. That is, the first pixel PXL1 in which the first wavelength conversion layer WCL1 is disposed may be a region emitting red light, and the second pixel PXL2 in which the second wavelength conversion layer WCL2 is disposed may be a region emitting green light.

For example, the first wavelength conversion particle WC1 and the second wavelength conversion particle WC2 may include a quantum dot, a quantum rod, phosphor, or the like. The quantum dot may be a particulate material that emits light of a certain wavelength while electron transits from a conduction band to a valence band.

In an embodiment, the quantum dot may be a semiconductor nano-crystal material. The quantum dot may have a specific band gap depending on the composition and size thereof to absorb light, and then may emit light having a unique wavelength. Examples of the semiconductor nano-crystal of the quantum dot may include a Group IV nano-crystal, a Group II-VI compound nano-crystal, a Group III-V compound nano-crystal, and a Group IV-VI nano-crystal or a combination thereof.

For example, the Group IV nano-crystal may include a binary compound, such as silicon (Si), germanium (Ge), silicon carbide (SiC), silicon-germanium (SiGe), and the like, but the present invention is not limited thereto.

In addition, the Group II-VI compound nano-crystal may include a binary compound, such as CdSe, CdTe, ZnS, ZnSe, ZnTe, ZnO, HgS, HgSe, HgTe, MgSe, MgS, and a mixture thereof, a tertiary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, or a quaternary compound, such as HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof, but the present invention is not limited thereto.

In addition, the Group III-V compound nano-crystal may include a binary compound, such as GaN, GaP, GaAs, GaSb, AlN, AlP, AlAs, AlSb, InN, InP, InAs, InSb, and a mixture thereof, a tertiary compound, such as GaNP, GaNAs, GaNSb, GaPAs, GaPSb, AlNP, AlNAs, AlNSb, AlPAs, AlPSb, InGaP, InNP, InNAs, InNSb, InPAs, InPSb, and a mixture thereof, or a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but the present invention is not limited thereto.

The Group IV-VI nano-crystals may include a binary compound, such as SnS, SnSe, SnTe, PbS, PbSe, PbSe, PbTe, and a mixture thereof, a tertiary compound, such as SnSeS, SnSeTe, SnSTe, PbSeS, PbSeTe, PbSTe, SnPbS, SnPbSe, SnPbTe, and a mixture thereof, or a quaternary compound, such as SnPbSSe, SnPbSeTe, SnPbSTe, and a mixture thereof, but the present invention is not limited thereto.

A shape of the quantum dot is a shape generally used in the art and is not particularly limited, and may be, for example, any of spherical, pyramidal, multi-arm-shaped or cubic nanoparticles, nanotubes, nanowires, nanofibers, and nanoplate-shaped particles, and the like. The binary compound, the tertiary compound, or the quaternary compound described above may exist in the same particle with a uniform concentration, or may exist in the same particle divided into states in which concentration distributions are partially different.

In an embodiment, the quantum dot may have a core-shell structure including a core including the nano-crystal described above and a shell surrounding the core. An interface between the core and the shell may have a concentration gradient that a concentration of an element existing in the shell decreases toward the center thereof. The shell of the quantum dot may serve as a protective layer for preventing a chemical denaturation of the core to maintain a semiconductor characteristic and/or a charging layer for providing a electrophoretic characteristic to the quantum dot. The shell may be a single layer or multiple layers. Examples of a shell of a quantum dot may be oxide of a metal or a nonmetal, a semiconductor compound, or a combination thereof.

For example, the oxide of a metal or a nonmetal may be a binary compound, such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, or a quaternary compound, such as $MgAl_2O_4$, $CoFe_2O_4$, $NiFe_2O_4$, $CoMn_2O_4$, and the like, but the present invention is not limited thereto.

In addition, the semiconductor compound may be any of CdS, CdSe, CdTe, ZnS, ZnSe, ZnTe, ZnSeS, GaAs, GaP, GaSb, HgS, HgSe, HgTe, InAs, InP, InSb, AlAs, AlP, AlSb, and the like, but the present invention is not limited thereto.

In an embodiment, the light emitted by the quantum dot may have a full width of half maximum (FWHM) of about 45 nm or less, thereby improving a color purity and a color reproducibility of a color displayed by the display device. In addition, the light emitted by the quantum dot may be emitted in various directions regardless of an incident direction of the incident light. Therefore, a lateral visibility of the display device may be improved.

In an embodiment, both the first wavelength conversion particle WC1 and the second wavelength conversion particle WC2 may consist of the quantum dot. In an embodiment, a diameter of the quantum dot constituting the first wavelength conversion particle WC1 may be greater than a diameter of the quantum dot constituting the second wavelength conversion particle WC2. For example, the diameter of the quantum dot constituting the first wavelength conversion particle WC1 may be about 55 Å to 65 Å, and the diameter of the quantum dot constituting the second wavelength conversion particle WC2 may be about 40 Å to 55 Å, but the present invention is not limited thereto.

The light scattering layer LSL may include a light scattering particle SC. In addition, as described above, the first wavelength conversion layer WCL1 and the second wavelength conversion layer WCL2 may further include a light scattering particle SC.

The light scattering particle SC may form an optical interface with the base resin BR with a different refractive index than the base resin BR. The light scattering particle SC is not particularly limited as long as it is a material capable of scattering at least some of transmitted light. For example, the light scattering particle SC may be an oxide particle, such as any of titanium oxide ($TiO_2$), aluminum oxide ($Al_2O_3$), indium oxide ($In_2O_3$), zinc oxide (ZnO), tin oxide ($SnO_2$), and silica.

The light scattering particle SC may scatter light in a random direction regardless of an incident direction of an incident light, without substantially changing a wavelength of light transmitting through the light scattering layer LSL. Therefore, a lateral visibility of the display device may be improved.

In an embodiment, a passivation layer PSV may be disposed on the light conversion layer LCL. The passivation layer PSV may include an inorganic insulating layer consisting of an inorganic material, may prevent moisture and/or oxygen from penetrating into the light conversion layer LCL from the outside, and may protect the wavelength conversion particles WC1 and WC2.

As described above, the light conversion layer LCL may be disposed on the light diffusion layer HZL. The light emitted from the light emitting element LD may be diffused by the light diffusion layer HZL to be uniformly incident on the light conversion layer LCL. Accordingly, a conversion efficiency of light incident into the light conversion layer LCL may be improved, and uniform light as a whole in a plane view may be emitted to the outside. Particularly, since the light incident on the first wavelength conversion layer WCL1 and the second wavelength conversion layer WCL2 is converted into a uniform color as a whole, it is possible to prevent or substantially prevent a color of the emitted light from varying in each region.

FIG. 15 and FIG. 16 are cross-sectional views of a pixel unit according to further embodiments. Herein, a difference from the embodiment shown in FIG. 14 will be described mainly.

FIG. 15 shows an embodiment in which a light diffusion layer of FIG. 14 is disposed on a light conversion layer and is a cross-sectional view taken along a line corresponding to the line III-III' of FIG. 13.

Referring to FIG. 15, a pixel unit PXUd may include first to third pixels PXL1d, PXL2d, and PXL3d, and the first to third pixels PXL1d, PXL2d, and PXL3d may include a light diffusion layer HZL disposed on a light conversion layer LCL.

In an embodiment, the light diffusion layer HZL may be directly disposed on a passivation layer PSV covering the light conversion layer LCL. In an embodiment, the light diffusion layer HZL may be entirely disposed on the passivation layer PSV. However, the present invention is not limited thereto, and the light diffusion layer HZL may be patterned and disposed only in some regions, as in the embodiment shown in FIG. 12. In another embodiment, the light diffusion layer HZL may be directly disposed on the light conversion layer LCL. In an embodiment, the light diffusion layer HZL may be disposed between the light conversion layer LCL and the passivation layer PSV.

The light diffusion layer HZL may uniformly diffuse light emitted from the light conversion layer LCL. Accordingly, a uniformity of the light emitted from the display device may be improved.

FIG. 16 shows an embodiment in which the light diffusion layer of FIG. 14 is not disposed and the light conversion layer includes a light diffusion particle, and is a cross-sectional view taken along a line corresponding to the line III-III' of FIG. 13.

Referring to FIG. 16, a pixel unit PXUe may include first to third pixels PXL1e, PXL2e, and PXL3e, and the first to third pixels PXL1e, PXL2e, and PXL3e may include a first wavelength conversion layer WCL1e, a second wavelength conversion layer WCL2e, and a light scattering layer LSLe.

The first wavelength conversion layer WCL1e, the second wavelength conversion layer WCL2e, and the light scattering layer LSLe may serve as a light diffusion layer including the light diffusion particle HZP.

The first wavelength conversion layer WCL1e, the second wavelength conversion layer WCL2e, and the light scattering layer LSLe may further include a light diffusion particle HZP dispersed in the base resin BR.

For example, the light diffusion particle HZP may include silver nanowires (AgNW), but is not limited thereto.

Light emitted from the light emitting element LD may be diffused by the light diffusion particle HZP inside the light conversion layer LCLe. Accordingly, uniform light as a whole may be emitted from each of the pixels PXL1e, PXL2e, and PXL3e.

In addition, when the light conversion layer LCLe includes the light diffusion particle HZP, it is possible to shorten a curing time of the base resin BR in which various particles are dispersed in a manufacturing process of the light conversion layer LCLe. That is, a manufacturing cost of the display device may be reduced.

While some example embodiments of the invention are described with reference to the attached drawings, it will be understood by those of ordinary skill in the technical field to which the present invention pertains that the present invention may be carried out in other forms without departing from the spirit and scope of the present invention. Accordingly, the above-described example embodiments should be considered in a descriptive sense only and not for purposes of limitation.

What is claimed is:

1. A display device comprising:
   a substrate;
   a first electrode and a second electrode arranged to be spaced apart from each other on the substrate;
   a first insulating layer on the substrate;
   a light emitting element on the first insulating layer, located between the first electrode and the second electrode, and comprising a first end portion and a second end portion;
   a third electrode on the substrate and electrically connected to the first electrode and the first end portion;
   a fourth electrode on the substrate and electrically connected to the second electrode and the second end portion;
   a second insulating layer on the substrate and covering the light emitting element, the third electrode, and the fourth electrode; and
   a light diffusion layer on the second insulating layer and comprising a light diffusion particle.

2. The display device of claim 1, wherein the light diffusion particle comprises at least one of a silver nanowire, a gold nanowire, a carbon nanowire, and a nickel nanowire.

3. The display device of claim 2, wherein
   the light diffusion layer further comprises a light scattering particle, and
   the light scattering particle comprises at least one of titanium oxide ($TiO_2$), aluminum oxide ($Al_2O_3$), indium oxide ($In_2O_3$), zinc oxide (ZnO), tin oxide ($SnO_2$), and silica.

4. The display device of claim 1, further comprising a first bank and a second bank on the substrate and arranged to be spaced apart from each other,
   wherein the first bank overlaps with the first electrode, and
   the second bank overlaps with the second electrode.

5. The display device of claim 4, wherein
   the first insulating layer comprises a first opening exposing at least a portion of the first electrode, and a second opening exposing at least a portion of the second electrode, and
   the first opening overlaps with the first bank, and the second opening overlaps with the second bank.

6. The display device of claim 1, wherein a space is defined between the light emitting element and the first insulating layer.

7. The display device of claim 1, further comprising a first insulating pattern on the light emitting element,
   wherein the first insulating pattern exposes the first end portion and the second end portion of the light emitting element.

8. The display device of claim 1, further comprising a second insulating pattern on the third electrode,
   wherein the second insulating pattern is arranged both on a region comprising the first end portion of the light emitting element and on the third electrode, and covers an end of the third electrode on the light emitting element.

9. The display device of claim 1, further comprising a bank pattern on the substrate and surrounding the light emitting element in a plane view.

10. The display device of claim 9, wherein the light diffusion layer overlaps with the light emitting element and does not overlap with the bank pattern.

11. The display device of claim 1, further comprising a wavelength conversion layer on the light emitting element and comprising a wavelength conversion particle,
    wherein the wavelength conversion particle comprises a quantum dot.

12. A display device comprising:
    a first pixel in a display area,
    wherein the first pixel comprises:
    a substrate;
    a first electrode and a second electrode arranged to be spaced apart from each other on the substrate;
    a first insulating layer on the substrate and exposing a portion of the first electrode and a portion of the second electrode;
    a light emitting element on the first insulating layer, located between the first electrode and the second electrode, and comprising a first end portion and a second end portion;
    a third electrode on the substrate and electrically connected to the first electrode and the first end portion;
    a fourth electrode on the substrate and electrically connected to the second electrode and the second end portion;
    a second insulating layer on the substrate and covering the light emitting element, the third electrode, and the fourth electrode;
    a light diffusion layer on the second insulating layer and comprising a light diffusion particle; and
    a first wavelength conversion layer on the substrate and comprising a first wavelength conversion particle,
    wherein the light emitting element emits light of a first color, and the first wavelength conversion particle converts the light of the first color into light of a second color.

13. The display device of claim 12, wherein the light diffusion particle comprises at least one of a silver nanowire, a gold nanowire, a carbon nanowire, and a nickel nanowire.

14. The display device of claim 13, further comprising a second pixel in the display area and arranged adjacent to the first pixel,
    wherein the second pixel comprises a second wavelength conversion layer comprising a second wavelength conversion particle, and
    the second wavelength conversion particle converts the light of the first color into light of a third color.

15. The display device of claim 14, further comprising a third pixel in the display area and arranged adjacent to the first pixel and the second pixel,
    wherein the third pixel comprises a light scattering particle, and the light scattering particle comprises at least one of titanium oxide ($TiO_2$), aluminum oxide ($Al_2O_3$), indium oxide ($In_2O_3$), zinc oxide (ZnO), tin oxide ($SnO_2$), and silica.

16. The display device of claim 14, further comprising a bank pattern between the first pixel and the second pixel,
    wherein the light diffusion layer does not overlap with the bank pattern.

17. The display device of claim 12, wherein the light diffusion layer is between the light emitting element and the first wavelength conversion layer.

18. The display device of claim 12, further comprising a passivation layer covering the first wavelength conversion layer, wherein the light diffusion layer is on the passivation layer.

19. A display device comprising:
    a substrate;
    a first electrode and a second electrode arranged to be spaced apart from each other on the substrate;
    a first insulating layer on the substrate;

a light emitting element on the first insulating layer, located between the first electrode and the second electrode, and comprising a first end portion and a second end portion;
a third electrode on the substrate and electrically connected to the first electrode and the first end portion;
a fourth electrode on the substrate and electrically connected to the second electrode and the second end portion;
a second insulating layer on the substrate and covering the light emitting element, the third electrode, and the fourth electrode; and
a wavelength conversion layer provided on the second insulating layer and comprising a wavelength conversion particle and a light diffusion particle,
wherein the light diffusion particle comprises at least one of a silver nanowire, a gold nanowire, a carbon nanowire, and a nickel nanowire.

* * * * *